United States Patent
Wu

(10) Patent No.: US 8,952,750 B2
(45) Date of Patent: *Feb. 10, 2015

(54) SEMICONDUCTOR POWER MODULES AND DEVICES

(71) Applicant: Transphorm Inc., Goleta, CA (US)

(72) Inventor: Yifeng Wu, Goleta, CA (US)

(73) Assignee: Transphorm Inc., Goleta, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/134,878

(22) Filed: Dec. 19, 2013

(65) Prior Publication Data

US 2014/0103989 A1 Apr. 17, 2014

Related U.S. Application Data

(63) Continuation of application No. 13/405,041, filed on Feb. 24, 2012, now Pat. No. 8,648,643.

(51) Int. Cl.
*H03K 17/56* (2006.01)
*H03K 17/16* (2006.01)
(Continued)

(52) U.S. Cl.
CPC ............ *H03K 17/164* (2013.01); *H01L 25/074* (2013.01); *H05K 1/0218* (2013.01); *H01L 2224/48091* (2013.01); *H03K 2217/0045* (2013.01); *H01L 2924/13055* (2013.01);
(Continued)

(58) Field of Classification Search
USPC ............................ 327/419, 566; 257/503, 506
See application file for complete search history.

(56) References Cited

U.S. PATENT DOCUMENTS

| 4,384,287 A | 5/1983 | Sakuma |
| 4,728,826 A | 3/1988 | Einzinger et al. |

(Continued)

FOREIGN PATENT DOCUMENTS

| CN | 101978589 | 2/2011 |
| CN | 102165694 | 8/2011 |

(Continued)

OTHER PUBLICATIONS

Authorized officer Keon Hyeong Kim, International Search Report and Written Opinion in PCT/US2008/076160 mailed Mar. 18, 2009, 11 pp.

(Continued)

*Primary Examiner* — Ryan Jager
(74) *Attorney, Agent, or Firm* — Fish & Richardson P.C.

(57) ABSTRACT

An electronic component is described which includes a first transistor encased in a first package, the first transistor being mounted over a first conductive portion of the first package, and a second transistor encased in a second package, the second transistor being mounted over a second conductive portion of the second package. The component further includes a substrate comprising an insulating layer between a first metal layer and a second metal layer. The first package is on one side of the substrate with the first conductive portion being electrically connected to the first metal layer, and the second package is on another side of the substrate with the second conductive portion being electrically connected to the second metal layer. The first package is opposite the second package, with at least 50% of a first area of the first conductive portion being opposite a second area of the second conductive portion.

31 Claims, 18 Drawing Sheets

(51) Int. Cl.
  *H01L 25/07* (2006.01)
  *H05K 1/02* (2006.01)
  *H01L 23/552* (2006.01)
  *H01L 23/64* (2006.01)
  *H01L 25/16* (2006.01)

(52) U.S. Cl.
  CPC .... *H05K1/0263* (2013.01); *H05K 2201/10015* (2013.01); *H05K 2201/10166* (2013.01); *H05K 2201/10545* (2013.01); *H01L 23/552* (2013.01); *H01L 23/642* (2013.01); *H01L 25/16* (2013.01); *H01L 2924/30107* (2013.01)
  USPC ............ 327/566; 327/419; 257/503; 257/506

(56) References Cited

U.S. PATENT DOCUMENTS

| | | |
|---|---|---|
| 4,808,853 A | 2/1989 | Taylor |
| 5,198,964 A | 3/1993 | Ito et al. |
| 5,379,209 A | 1/1995 | Goff |
| 5,493,487 A | 2/1996 | Close et al. |
| 5,637,922 A | 6/1997 | Fillion et al. |
| 5,952,856 A | 9/1999 | Horiguchi et al. |
| 6,008,684 A | 12/1999 | Ker et al. |
| 6,107,844 A | 8/2000 | Berg et al. |
| 6,130,831 A | 10/2000 | Matsunaga |
| 6,172,550 B1 | 1/2001 | Gold et al. |
| 6,333,617 B1 | 12/2001 | Itabashi et al. |
| 6,395,593 B1 | 5/2002 | Pendharkar et al. |
| 6,521,940 B1 | 2/2003 | Vu et al. |
| 6,650,169 B2 | 11/2003 | Faye et al. |
| 6,781,423 B1 | 8/2004 | Knoedgen |
| 6,900,657 B2 | 5/2005 | Bui et al. |
| 7,116,567 B2 | 10/2006 | Shelton et al. |
| 7,304,331 B2 | 12/2007 | Saito et al. |
| 7,378,883 B1 | 5/2008 | Hsueh |
| 7,443,648 B2 | 10/2008 | Cutter et al. |
| 7,477,082 B2 | 1/2009 | Fukazawa |
| 7,501,669 B2 | 3/2009 | Parikh et al. |
| 7,548,112 B2 | 6/2009 | Sheppard |
| 7,612,602 B2 | 11/2009 | Yang et al. |
| 7,639,064 B2 | 12/2009 | Hsiao et al. |
| 7,719,055 B1 | 5/2010 | McNutt et al. |
| 7,746,020 B2 | 6/2010 | Schnetzka et al. |
| 7,804,328 B2 | 9/2010 | Pentakota et al. |
| 7,851,825 B2 | 12/2010 | Suh et al. |
| 7,875,907 B2 | 1/2011 | Honea et al. |
| 7,875,914 B2 | 1/2011 | Sheppard |
| 7,915,643 B2 | 3/2011 | Suh et al. |
| 7,920,013 B2 | 4/2011 | Sachdev et al. |
| 7,965,126 B2 | 6/2011 | Honea et al. |
| 8,013,580 B2 | 9/2011 | Cervera et al. |
| 8,648,643 B2 * | 2/2014 | Wu ................. 327/419 |
| 2002/0125920 A1 | 9/2002 | Stanley |
| 2003/0178654 A1 | 9/2003 | Thornton |
| 2004/0178831 A1 | 9/2004 | Li et al. |
| 2005/0052221 A1 | 3/2005 | Kohnotoh et al. |
| 2005/0067716 A1 | 3/2005 | Mishra et al. |
| 2005/0077947 A1 | 4/2005 | Munzer et al. |
| 2005/0146310 A1 | 7/2005 | Orr |
| 2005/0189561 A1 | 9/2005 | Kinzer et al. |
| 2005/0189562 A1 | 9/2005 | Kinzer et al. |
| 2005/0218964 A1 | 10/2005 | Oswald et al. |
| 2006/0033122 A1* | 2/2006 | Pavier et al. ............ 257/177 |
| 2006/0043499 A1 | 3/2006 | De Cremoux et al. |
| 2006/0060871 A1 | 3/2006 | Beach |
| 2006/0102929 A1 | 5/2006 | Okamoto et al. |
| 2006/0158166 A1* | 7/2006 | Van Der Wal ............ 323/282 |
| 2006/0176007 A1 | 8/2006 | Best |
| 2006/0237825 A1 | 10/2006 | Pavier et al. |
| 2006/0238234 A1 | 10/2006 | Benelbar et al. |
| 2006/0261473 A1 | 11/2006 | Connah et al. |
| 2007/0018210 A1 | 1/2007 | Sheppard |
| 2007/0080672 A1 | 4/2007 | Yang |
| 2007/0090373 A1 | 4/2007 | Beach et al. |
| 2007/0146045 A1 | 6/2007 | Koyama |
| 2007/0278518 A1 | 12/2007 | Chen et al. |
| 2008/0017998 A1 | 1/2008 | Pavio |
| 2008/0018366 A1 | 1/2008 | Hanna |
| 2008/0122418 A1 | 5/2008 | Briere et al. |
| 2008/0136390 A1 | 6/2008 | Briere |
| 2008/0158110 A1 | 7/2008 | Iida et al. |
| 2008/0191342 A1 | 8/2008 | Otremba |
| 2008/0203559 A1 | 8/2008 | Lee et al. |
| 2008/0231211 A1* | 9/2008 | Baarman et al. ............ 315/294 |
| 2008/0248634 A1 | 10/2008 | Beach |
| 2008/0272404 A1 | 11/2008 | Kapoor |
| 2008/0283844 A1 | 11/2008 | Hoshi et al. |
| 2009/0072269 A1 | 3/2009 | Suh et al. |
| 2009/0085219 A1 | 4/2009 | Bayerer |
| 2009/0167411 A1 | 7/2009 | Machida et al. |
| 2009/0180304 A1 | 7/2009 | Bahramian et al. |
| 2009/0201072 A1 | 8/2009 | Honea et al. |
| 2009/0215230 A1 | 8/2009 | Muto et al. |
| 2009/0236728 A1 | 9/2009 | Satou et al. |
| 2009/0278513 A1 | 11/2009 | Bahramian et al. |
| 2009/0315594 A1 | 12/2009 | Pentakota et al. |
| 2010/0067275 A1 | 3/2010 | Wang et al. |
| 2010/0073067 A1 | 3/2010 | Honea |
| 2010/0079192 A1 | 4/2010 | Strzalkowski |
| 2010/0097119 A1 | 4/2010 | Ma et al. |
| 2010/0117095 A1 | 5/2010 | Zhang |
| 2010/0328833 A1 | 12/2010 | Frisch et al. |
| 2011/0019450 A1 | 1/2011 | Callanan et al. |
| 2011/0025397 A1 | 2/2011 | Wang et al. |
| 2011/0121314 A1 | 5/2011 | Suh et al. |
| 2011/0169549 A1 | 7/2011 | Wu |
| 2011/0285378 A1* | 11/2011 | Tamaoka .................. 323/351 |
| 2011/0298813 A1 | 12/2011 | Muehlschlegel |
| 2012/0181674 A1* | 7/2012 | Cho et al. .................. 257/666 |
| 2012/0195074 A1* | 8/2012 | Lehn ............................ 363/17 |
| 2012/0286571 A1* | 11/2012 | Baarman et al. ............ 307/11 |
| 2013/0015495 A1* | 1/2013 | Hauenstein ................ 257/140 |
| 2013/0222045 A1 | 8/2013 | Wu |

FOREIGN PATENT DOCUMENTS

| | | |
|---|---|---|
| CN | 102308387 | 1/2012 |
| EP | 2 188 842 | 5/2010 |
| EP | 2 243 213 | 10/2010 |
| JP | 5-075040 | 3/1993 |
| JP | 6-067744 | 3/1994 |
| JP | 2000-101356 | 4/2000 |
| JP | 2000-124358 | 4/2000 |
| JP | 2003-244943 | 8/2003 |
| JP | 2003-338742 | 11/2003 |
| JP | 2004-281454 | 10/2004 |
| JP | 2006-033723 | 2/2006 |
| JP | 2006-173754 | 6/2006 |
| JP | 2007-036218 | 2/2007 |
| JP | 2007-215331 | 8/2007 |
| JP | 2007-294769 | 11/2007 |
| JP | 2008-199771 | 8/2008 |
| JP | 2010-539712 | 12/2010 |
| JP | 2011-512119 | 4/2011 |
| JP | 2012-517699 | 8/2012 |
| KR | 10-1998-0021826 | 6/1998 |
| TW | 200941920 | 10/2009 |
| TW | 201027912 | 7/2010 |
| TW | 201036155 | 10/2010 |
| TW | 201126686 | 8/2011 |
| TW | 201143017 | 12/2011 |
| WO | WO 2009/036181 | 3/2009 |
| WO | WO 2009/102732 | 8/2009 |
| WO | WO 2010/039463 | 4/2010 |
| WO | WO 2010/090885 | 8/2010 |
| WO | WO 2011/053981 | 5/2011 |
| WO | WO 2011/085260 | 7/2011 |
| WO | WO 2011/097302 | 8/2011 |
| WO | WO 2013/085839 | 6/2013 |

OTHER PUBLICATIONS

Authorized officer Simin Baharlou, International Preliminary Report on Patentability in PCT/US2008/076160, mailed Mar. 25 2010, 6 pp.

(56) References Cited

OTHER PUBLICATIONS

Authorized officer Jae Woo Wee, International Search Report and Written Opinion in PCT/US2009/033699, mailed Sep. 21, 2009, 11 pp.
Authorized officer Dorothée Mülhausen, International Preliminary Report on Patentability in PCT/US2009/033699, mailed Aug. 26, 2010, 6 pp.
Authorized officer Sung Hee Kim, International Search Report and the Written Opinion in PCT/US2009/057554, mailed May 10, 2010, 13 pp.
Authorized Officer Gijsbertus Beijer, International Preliminary Report on Patentability in PCT/US2009/057554, mailed Mar. 29, 2011, 7 pp.
Authorized officer Sung Chan Chung, International Search Report and Written Opinion for PCT/US2010/021824, mailed Aug. 23, 2010, 9 pp.
Authorized officer Beate Giffo-Schmitt, International Preliminary Report on Patentability in PCT/US2010/021824, mailed Aug. 23, 2010, 6 pp.
Authorized officer Bon Gyoung Goo, International Search Report and Written Opinion in PCT/US2010/055129, mailed Jul. 1, 2011, 11 pp.
Authorized officer Yolaine Cussac, International Preliminary Report on Patentability in PCT/US2010/055129, mailed May 18, 2012, 6 pp.
Authorized officer Kee Young Park, International Search Report and Written Opinion in PCT/US2011/023485, mailed Sep. 23, 2011, 10 pp.
Authorized officer Nora Lindner, International Preliminary Report on Patentability in PCT/US2011/023485, mailed Aug. 16, 2012, 7 pages.
Authorized officer Sung Joon Lee, International Search Report and Written Opinion in PCT/US2011/020592, mailed Sep. 19, 2011, 9 pages.
Authorized officer Philippe Bécamel, International Preliminary Report on Patentability in PCT/US2011/020592, mailed Jul. 19, 2012, 7 pages.
Authorized officer Kwak In Gu, International Search Report and Written Opinion in PCT/US2012/026810, mailed Jan. 23, 2013, 10 pages.
Authorized officer Sang Won Choi, International Search Report and Written Opinion in PCT/US2013/027294, mailed Jun. 26, 2013, 10 pages.
Chen, et al., "Single-Chip Boost Converter Using Monolithically Integrated AlGan/GaN Lateral Field-Effect Rectifier and Normally Off HEMT," IEEE Electron Device Letters, May 2009, 30(5):430-432.
Napierala et al. (2006), "Selective GaN Epitaxy on Si(111) Substrates Using Porous Aluminum Oxide Buffer Layers," Journal of the Electrochemical Society, 153(2):G125-G127, 4 pages.
Search Report and Action in TW Application No. 098132132, issued Dec. 6, 2012, 8 pages.
Wu et al., "A 97.8% Efficient GaN HEMT Boost Converter with 300-W Output Power at 1MHz," Aug. 2008, Electronic Device Letters, IEEE, 29(8):824-826.
Authorized officer Kihwan Moon, International Preliminary Report on Patentability in PCT/US2013/027294, mailed Sep. 4, 2014, 7 pages.

\* cited by examiner

US 8,952,750 B2

SEMICONDUCTOR POWER MODULES AND DEVICES

CROSS-REFERENCE TO RELATED APPLICATION

This application is a continuation application of U.S. patent application Ser. No. 13/405,041, filed Feb. 24, 2012, the disclosure of which is hereby incorporated by reference in its entirety.

TECHNICAL FIELD

This invention relates to configurations for electronic modules formed of semiconductor electronic devices.

BACKGROUND

Power switching circuits such as bridge circuits are commonly used in a variety of applications. A circuit schematic of a 3-phase bridge circuit 10 configured to drive a motor is shown in FIG. 1. Each of the three half bridges 15, 25, and 35 in circuit 10 includes two transistors, 41 and 42, 43 and 44, and 45 and 46, respectively, which are able to block voltage in a first direction and are capable of conducting current in the first direction or optionally in both directions. In applications where the transistors employed in the bridge circuit 10 are only capable of conducting current in one direction, for example when silicon IGBTs are used, an anti-parallel diode (not shown) may be connected to each of the transistors 41-46. Each of transistors 41-46 is capable of blocking a voltage at least as large as the high voltage (HV) source 11 of the circuit 10 when they are biased in the OFF state. That is, when the gate-source voltage $V_{GS}$ of any of transistors 41-46 is less than the transistor threshold voltage $V_{th}$, no substantial current flows through the transistor when the drain-source voltage $V_{DS}$ (i.e., the voltage at the drain relative to the source) is between 0V and HV. When biased in the ON state (i.e., with $V_{GS}$ greater than the transistor threshold voltage), the transistors 41-46 are each capable of conducting sufficiently high current for the application in which they are used.

The transistors 41-46 may be enhancement mode or E-mode transistors (normally off, $V_{th}>0$), or depletion mode or D-mode (normally on, $V_{th}<0$) transistors. In power circuits, enhancement mode devices are typically used to prevent accidental turn on which may cause damage to the devices or other circuit components. Nodes 17, 18, and 19 are all coupled to one another via inductive loads, i.e., inductive components such as motor coils (not shown in FIG. 1).

FIG. 2a shows half bridge 15 of the full 3-phase motor drive in FIG. 1, along with the winding of the motor (represented by inductive component 21) between nodes 17 and 18. Also shown is transistor 44, into which the motor current feeds. For this phase of power, transistor 44 is continuously ON ($V_{gs44}>V_{th}$) and transistor 42 is continuously OFF ($V_{gs42}<V_{th}$, i.e., $V_{gs42}=0V$ if enhancement mode transistors are used), while transistor 41 is modulated with a pulse width modulation (PWM) signal to achieve the desired motor current. FIG. 2b indicates the path of the current 27 during the time that transistor 41 is biased ON. For this bias, the motor current flows through transistors 41 and 44, while no current flows through transistor 42 because transistor 42 is biased OFF, and the voltage at node 17 is close to HV, so transistor 42 blocks a voltage which is close to HV.

As used herein, the term "blocking a voltage" refers to a transistor, device, or component being in a state for which significant current, such as current that is greater than 0.001 times the average operating current during regular ON-state conduction, is prevented from flowing through the transistor, device, or component when a voltage is applied across the transistor, device, or component. In other words, while a transistor, device, or component is blocking a voltage that is applied across it, the total current passing through the transistor, device, or component will not be greater than 0.001 times the average operating current during regular ON-state conduction.

Referring to FIG. 2c, when transistor 41 is switched OFF, no current can flow through transistor 41, so the motor current flows in the reverse direction through transistor 42, which can occur whether transistor 42 is biased ON or OFF. Alternatively, an anti-parallel freewheeling diode (not shown) can be connected across transistor 42, in which case the reverse current flows through the freewheeling diode. During such operation, the inductive component 21 forces the voltage at node 17 to a sufficiently negative value to cause reverse conduction through transistor 42, and transistor 41 blocks a voltage which is close to HV.

FIGS. 3a-3c show operation of the half bridge 15 under conditions where current passes through the inductive load in the opposite direction as compared to that shown in FIGS. 2a-2c, and the voltage at node 17 is controlled by switching the low-side transistor 42. For the mode of operation illustrated in FIGS. 3a-3c, the motor current 27 is fed into the inductive motor 21 through transistor 43. During this mode of operation, transistor 43 is continuously ON ($V_{gs43}>V_{th}$) and transistor 41 is continuously OFF ($V_{gs41}<V_{th}$, i.e., $V_{gs41}=0V$ if enhancement mode transistors are used), while transistor 42 is modulated with a pulse width modulation (PWM) signal to achieve the desired motor current. FIG. 3b indicates the path of the current 27 during the time that transistor 42 is biased ON. For this bias, the motor current flows through transistors 43 and 42, while no current flows through transistor 41 because transistor 41 is biased OFF, and the voltage at node 17 is close to 0 V, so transistor 41 blocks a voltage which is close to HV.

Referring to FIG. 3c, when transistor 42 is switched OFF, no current can flow through transistor 42, so the motor current flows in the reverse direction through transistor 41, which can occur whether transistor 41 is biased ON or OFF. Alternatively, an anti-parallel freewheeling diode (not shown) can be connected across transistor 41, in which case the reverse current flows through the freewheeling diode. During such operation, the inductive component 21 forces the voltage at node 17 to a sufficiently high value (slightly higher than HV) to cause reverse conduction through transistor 41, and transistor 42 blocks a voltage which is close to or slightly higher than HV.

In addition to their use in motor-drive applications, half bridges and bridge circuits can also be used in many other applications, for example boost or buck converters or in power supplies. An exemplary circuit which utilizes a half bridge 15 to drive an electrical load 28 is illustrated in FIG. 4. The electrical load 28 can, for example, be capacitive and/or resistive, or in some cases could be a battery or DC power supply. As further illustrated in FIG. 4, in many applications a filter 22, which can include inductive and/or capacitive elements 23 and 24, respectively, is inserted between the half bridge 15 and the electrical load 28.

The mode of switching illustrated in FIGS. 2a-2c and 3a-3c is commonly known as hard-switching. A hard-switching circuit configuration is one in which the switching transistors are configured to have high currents passing through them as soon as they are switched ON, and to have high voltages across them as soon as they are switched OFF. In other words, the transistors are switched ON during periods where non-zero currents flow through the inductive load, so substantial current flows through the transistors immediately or soon after the transistors are switched ON, rather than the current rising gradually. Similarly, the transistors are switched OFF during periods where high voltages must be blocked by the transistors, so substantial voltage is blocked by the transistors immediately or soon after the transistors are switched OFF, rather than the voltage rising gradually. Transistors switched under these conditions are said to be "hard-switched".

Alternative circuit configurations make use of additional passive and/or active components, or alternatively signal timing techniques, to allow the transistors to be "soft-switched". A soft-switching circuit configuration is one in which the switching transistors are configured to be switched ON during zero-current (or near zero-current) conditions and switched OFF during zero-voltage (or near zero-voltage) conditions. Soft-switching methods and configurations have been developed to address the high levels of electro-magnetic interference (EMI) and associated ringing observed in hard-switched circuits, especially in high current and/or high voltage applications. While soft-switching can in many cases alleviate these problems, the circuitry required for soft switching typically includes many additional components, resulting in increased overall cost and complexity. Soft-switching also typically requires that the circuits be configured to switch only at specific times when the zero-current or zero-voltage conditions are met, hence limiting the control signals that can be applied and in many cases reducing circuit performance. Hence, alternative configurations and methods are desirable for hard-switched power switching circuits in order to maintain sufficiently low levels of EMI.

SUMMARY

In one aspect, an electronic component is described which includes a first transistor encased in a first package, the first package including a first conductive portion having a first area, with the first transistor being mounted over the first conductive portion. The electronic component further includes a second transistor encased in a second package, the second package including a second conductive portion having a second area, the second transistor being mounted over the second conductive portion. The electronic component also includes a substrate comprising an insulating layer between a first metal layer and a second metal layer, the first metal layer being on a first side of the substrate and the second metal layer being on a second side of the substrate. The first package is on the first side of the substrate with the first conductive portion being electrically connected to the first metal layer, the second package is on the second side of the substrate with the second conductive portion being electrically connected to the second metal layer, and the first package is opposite the second package, with at least 50% of the first area of the first conductive portion being opposite the second area of the second conductive portion.

In another aspect, an electronic component is described which includes a first transistor encased in a first package, the first package having a source lead and a first conductive portion, with the first transistor being mounted over the first conductive portion. The electronic component also includes a second transistor encased in a second package, the second package having a drain lead and a second conductive portion, with the second transistor being mounted over the second conductive portion. The electronic component further includes a substrate comprising an insulating layer between a first metal layer and a second metal layer, the first metal layer being on a first side of the substrate and the second metal layer being on a second side of the substrate. The first package is on the first side of the substrate with the first conductive portion being electrically connected to the first metal layer, the second package is on the second side of the substrate with the second conductive portion being electrically connected to the second metal layer, and the first package is at least partially opposite the second package, with the source lead of the first package being substantially aligned with the drain lead of the second package.

In yet another aspect, an electronic component is described which includes a capacitor comprising an insulating layer between a first electrically conductive layer and a second electrically conductive layer. The electronic component also includes a first transistor encased in a first package, the first package having a first conductive portion, and a second transistor encased in a second package, the second package having a second conductive portion. The first conductive portion is mounted directly over the first electrically conductive layer, and the second conductive portion is mounted directly over the second electrically conductive layer.

In still another aspect, a half bridge configured to be connected to an electrical load is described. The half bridge includes a first switch encased in a first package and a second switch encased in a second package, the first package having a source lead and the second package having a drain lead, with the source lead of the first package being electrically connected to the drain lead of the second package. The half bridge is operable to hard-switch a voltage of at least 300 Volts across the electrical load at a switching rate of at least 100 Volts/nanosecond while a current of at least 3 Amps flows through the electrical load.

The electronic components and half bridges described herein can include one or more of the following features. The first and second transistors can be part of a half bridge circuit. The substrate can form a capacitor which serves to stabilize a voltage between the first and second metal layers during operation of the half bridge circuit. The capacitor formed by the substrate can be a first capacitor, the electronic component further comprising a second capacitor connected in parallel to the first capacitor. The substrate can include a via hole, and a lead of the second capacitor can pass through the via hole. The first package can have a source lead and the second package can have a drain lead, with the source and drain leads being electrically connected to one another. The substrate can include a via hole, and a connector which electrically connects the source lead of the first package to the drain lead of the second package can pass through the via hole. The first transistor can have a first electrode which is electrically connected to the first conductive portion, and the second transistor can have a second electrode which is electrically connected to the second conductive portion. The first electrode can be a drain electrode of the first transistor, and the second electrode can be a source electrode of the second transistor. The first conductive portion can be directly on and contacting the first metal layer, and the second conductive portion can be directly on and contacting the second metal layer.

The first transistor or the second transistor can be a III-Nitride transistor or a lateral device. The first package can have a source lead and the second package can have a drain lead, with the source lead being substantially aligned with the drain lead. The electronic component can further include a third transistor encased in the first package, where a source of the first transistor is electrically connected to a drain of the third transistor, and a gate of the first transistor is electrically connected to a source of the second transistor. The first transistor can be a high-voltage depletion-mode transistor, and the third transistor can be a low-voltage enhancement-mode transistor.

The substrate can be a printed circuit board (PCB) substrate, such as a 2-layer printed circuit board (PCB) substrate. A drain electrode of the first transistor can be electrically connected to the first conductive portion, and a source electrode of the second transistor can be electrically connected to the second conductive portion. The first package can have a drain lead and the second package can have a source lead, with the drain lead of the first package electrically connected to the first conductive portion, and the source lead of the second package electrically connected to the second conductive portion. The electronic component can comprise a half bridge module, which can be configured to be connected to an electrical load. The first conductive portion can be electrically connected to the first electrically conductive layer, and the second conductive portion can be electrically connected to the second electrically conductive layer. The current through an electrical load can be at least 6 amps, and the first switch and the second switch can be on opposite sides of a substrate.

In yet another aspect, a method of operating a half bridge circuit comprising a first switch encased in a first package and a second switch encased in a second package is described. The method includes biasing a drain of the first switch at a voltage of at least 300 Volts relative to a source of the second switch, and biasing the first switch on and biasing the second switch off, thereby causing a current of at least 3 Amps to flow through the first switch and causing the second switch to block a voltage. The method further includes at a first time switching the first switch off, causing the current to flow through the second switch and causing the first switch to block a voltage. The switching of the first switch comprises hard-switching of the first switch at a switching rate of at least 100 Volts/nanosecond.

Methods described herein can each include one or more of the following features. The first switch and the second switch can each comprise one or more transistors. The method can further comprise at a second time switching the first switch from off to on, causing the current to flow through the first switch and causing the second switch to block a voltage. The second time can be after the first time. The method can further comprise connecting the half bridge circuit to an electrical load, wherein the current flows through the electrical load. The drain of the first switch can be biased at a voltage of at least 400 Volts relative to the source of the second switch.

The details of one or more embodiments of the subject matter described in this specification are set forth in the accompanying drawings and the description below. Other features, aspects, and advantages of the subject matter will become apparent from the description, the drawings, and the claims.

DESCRIPTION OF DRAWINGS

Like reference symbols in the various drawings indicate like elements.

DETAILED DESCRIPTION

Described herein are electronic components and methods suitable for maintaining low levels of EMI in electronic power switching circuits, thereby allowing for higher circuit stability and improved performance. The described electronic components can also have a reduced size as compared to conventional components, thereby allowing for lower production costs.

The transistors or other switching devices in the circuits described herein are typically configured to be hard-switched, as previously described, at very high switching rates (i.e., with very short switching times). When a transistor of one of the circuits herein is in the OFF state with no substantial current flowing through it, it typically supports a voltage which is close to the circuit high voltage. When a transistor of one of the circuits herein is in the ON state, it typically has substantial current passing through it with only a small voltage across it. The switching time of a switching transistor switched under hard-switching conditions is defined as follows. When the transistor is switched from the OFF state described above to the ON state described above, the current through the device begins to increase at the onset of switching, the rate of increase being adjustable by adjusting the conditions of the control circuitry, while the voltage across the device remains approximately the same. The voltage across the device does not drop substantially until the point at which substantially all the load current passes through the transistor. The time that elapses between the onset of switching and the drop in voltage across the device is referred to as the "switching time" for turning the transistor on. The total voltage switched across the device divided by the switching time (dV/dt) is referred to as the "voltage switching rate" or just the "switching rate".

When switching the transistor from the ON state to the OFF state, the voltage across the device increases to the OFF state voltage approximately at the onset of switching, while the decrease in current from the ON state value to the OFF state value takes a longer time, the rate of decrease again being adjustable by adjusting the conditions of the control circuitry. The time that elapses between the onset of switching and the drop to zero current through the device is referred to as the "switching time" for turning the transistor OFF. The total current switched through the device divided by the switching time (dI/dt) is referred to as the "current switching rate" or just the "switching rate". In general, while shorter switching times (and therefore higher switching rates) typically result in lower switching losses, they typically also cause higher levels of EMI, which can degrade circuit components or damage them such that they are rendered inoperable.

Figure 1:
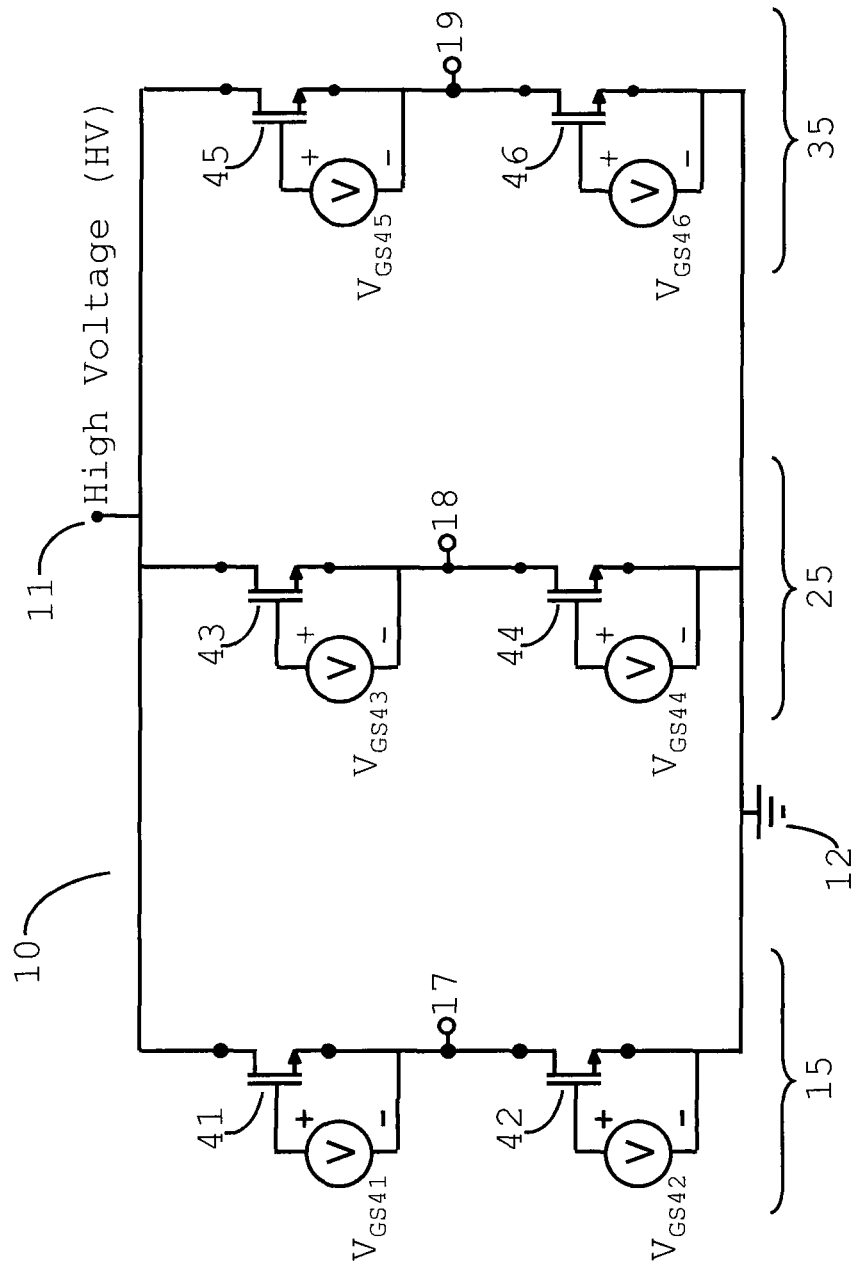
FIG. 1 illustrates a circuit schematic of a prior art 3-phase bridge circuit.
Figure 2A:
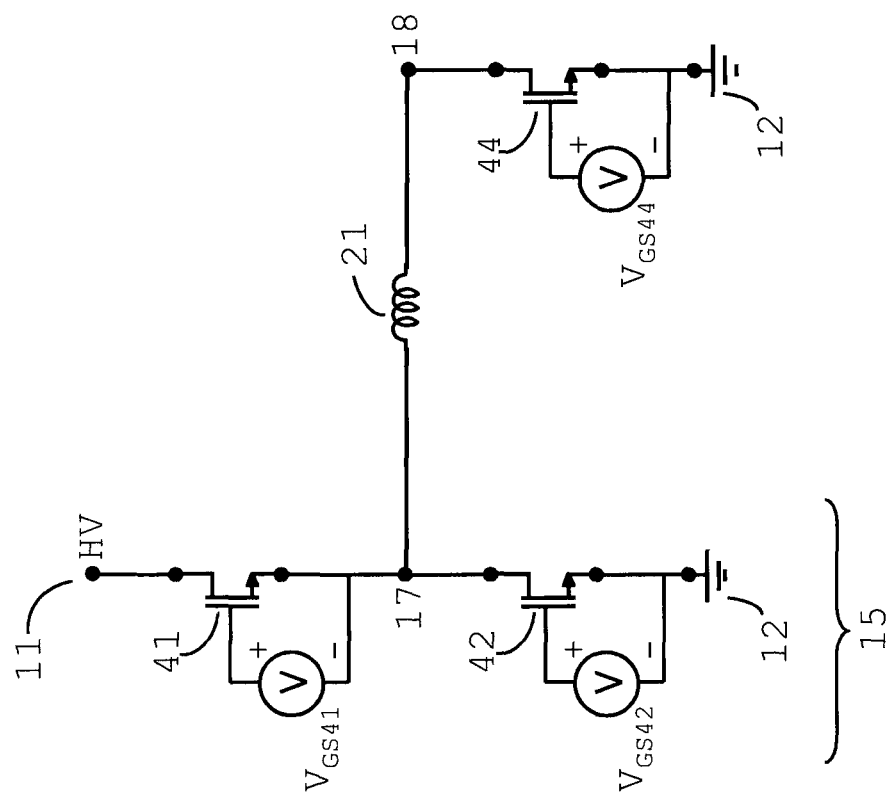
FIGS. 2a-c and 3a-c illustrate portions of the prior art 3-phase bridge circuit of FIG. 1 under various operating conditions.
Figure 5A:
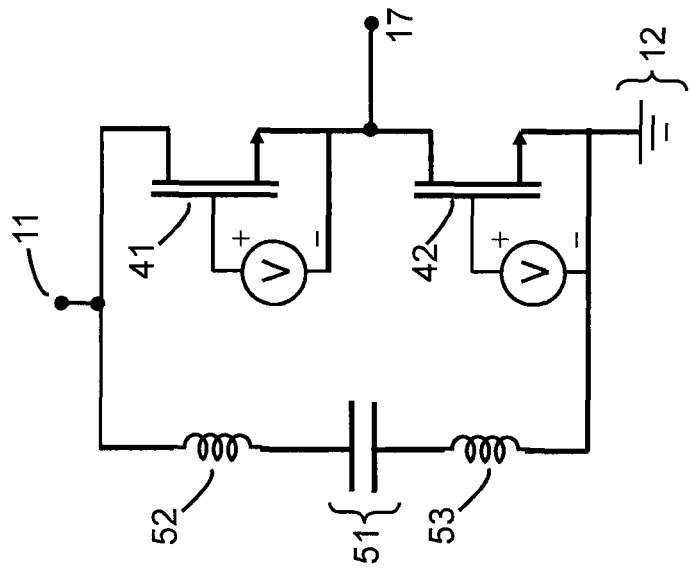
FIGS. 5a-b illustrate circuit schematics of a portion of a bridge circuit.

In order to ensure proper operation of the circuits in FIGS. 1-2, the DC High Voltage node 11 must be maintained as an AC ground. That is, node 11 can be capacitively coupled to DC ground 12 by connecting one terminal of a capacitor 51 to the High Voltage node 11 and the other terminal of the capacitor to ground 12, as illustrated in FIG. 5a. Hence, when either of transistors 41 or 42 are switched ON or OFF, the capacitor 51 can charge or discharge as needed to provide the current necessary to maintain a substantially constant voltage at the high- and low-voltage sides of the circuit. The EMI produced by higher switching rates typically results in the capacitor 51 needing to provide higher current levels in order to stabilize the circuit. In many cases, the conductive connectors between the capacitor 51 and the circuit have large parasitic inductance, represented by inductors 52 and 53 in FIG. 5b. This parasitic inductance prevents current passing through capacitor 51 from being able to switch sufficiently quickly, thereby preventing capacitor 51 from providing current at a fast enough rate to prevent voltage variations across transistors 41 or 42 after either of the transistors is switched ON or OFF. This can result in deleterious effects such as voltage oscillations (i.e., ringing) and excessively large levels of EMI. In particular, excessively large voltage oscillations across any of the transistors in the circuit can result in the transistor breaking down and being rendered inoperable.

Figure 6:
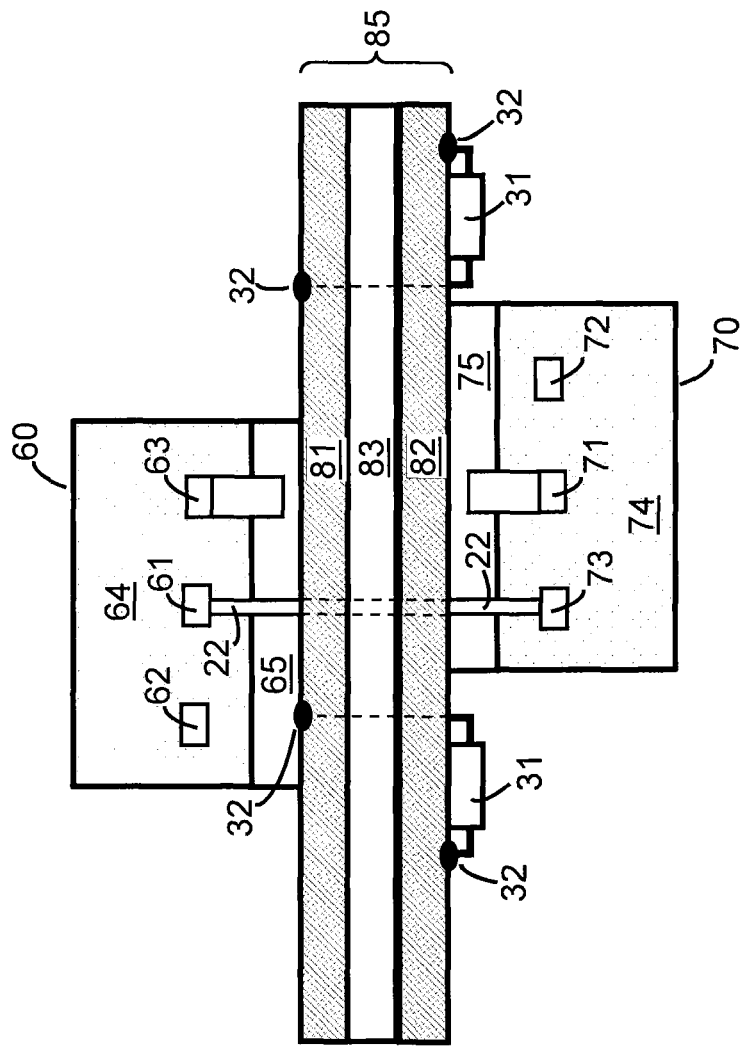
FIG. 6 is a cross-sectional schematic view of an electronic component configured to function as a half bridge module.
Figure 7A:
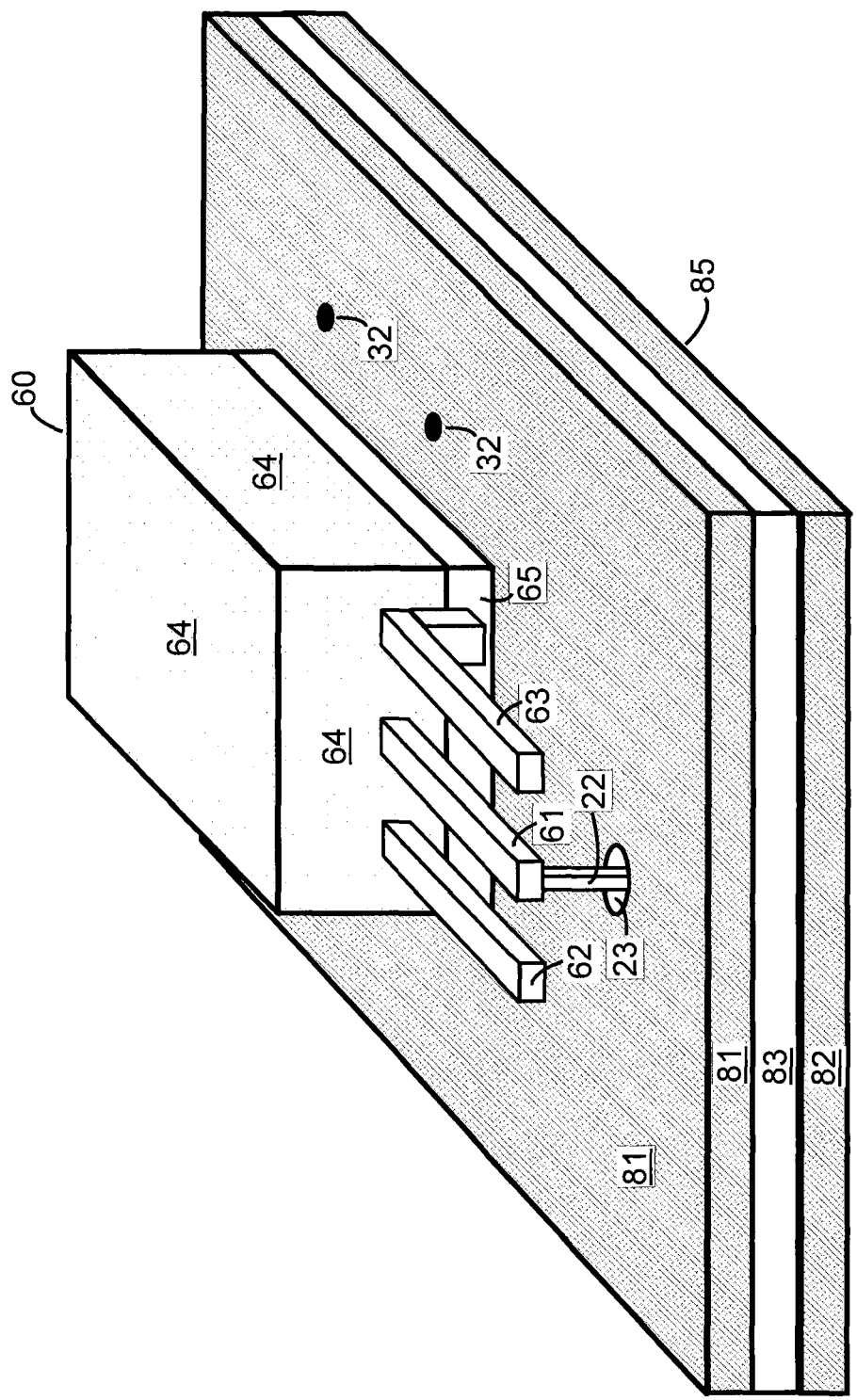
FIGS. 7a and 7b are perspective views of the electronic component of FIG. 4.
Figure 7B:
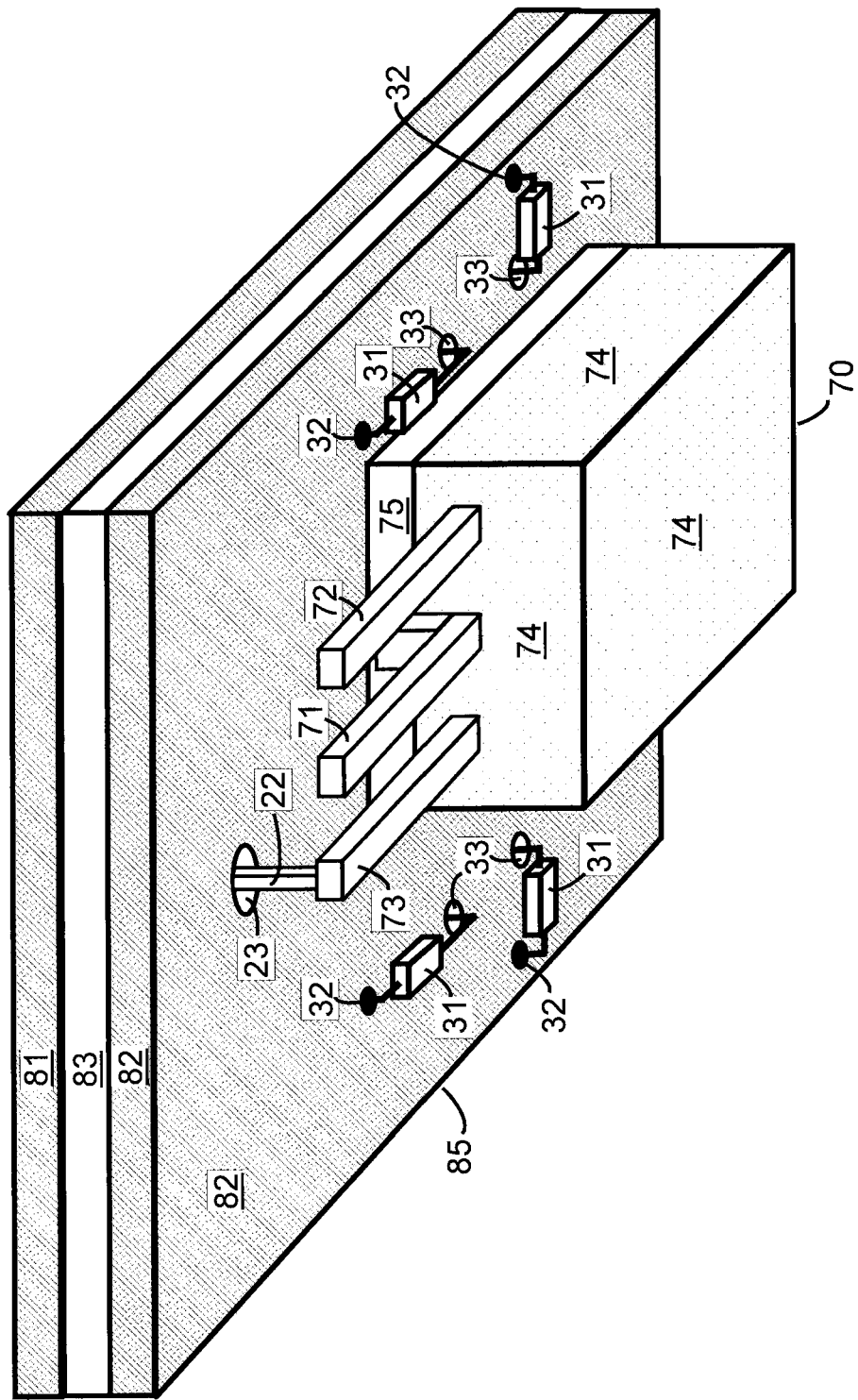

FIG. 6 is a cross-sectional schematic view of an electronic component configured to function as a half bridge module. The electronic component is configured such that parasitic inductances are minimized, thereby allowing for hard switching of large currents and voltages at very high switching rates with acceptably low EMI and ringing, as will be described below. The electronic component includes each of the circuit elements depicted in the circuit diagram of FIG. 5a. Specifically, the electronic component includes a high-side switch 60 and a low-side switch 70, which correspond to transistors 41 and 42, respectively, in FIG. 5a. Switches 60 and 70 are mounted on opposite sides of a 2-layer printed circuit board (PCB) substrate 85, which provides a rigid surface to which switches 60 and 70 can be secured, and also functions as capacitor 51 in FIG. 5a. FIGS. 7a and 7b are perspective views of the electronic component of FIG. 6, and FIGS. 8a and 8b are cross-sectional views of high-side switch 60 and low-side switch 70, respectively, illustrating the transistors 90 contained within the respective packages of switches 60 and 70.

Figure 8A:
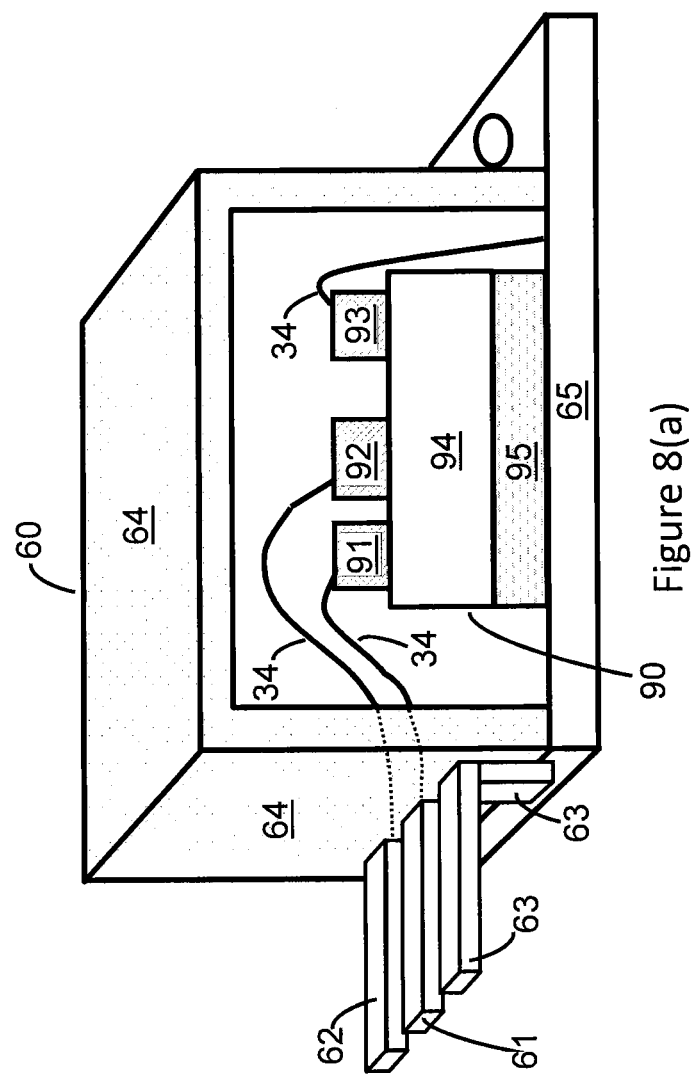
FIG. 8a is a cross-sectional view of a high-side switch in a half bridge module.
Figure 8B:
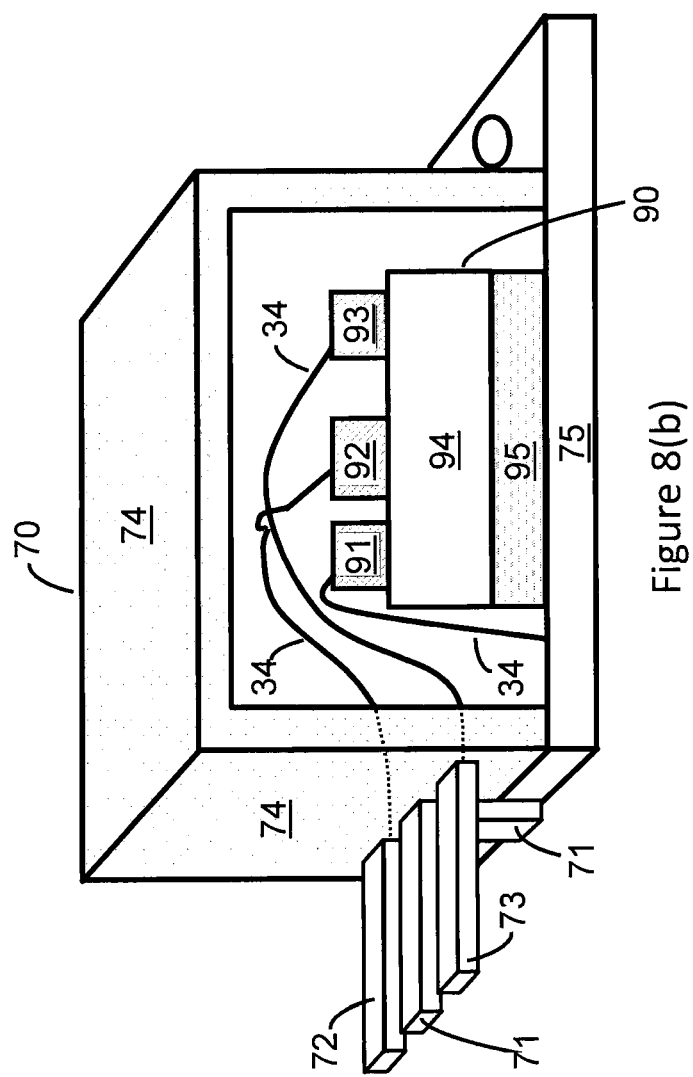
FIG. 8b is a cross-sectional view of a low-side switch in a half bridge module.

As illustrated in FIGS. 8a and 8b, switches 60 and 70 each include a transistor 90 encased and encapsulated in a package, the package surrounding the transistor. The packages of switches 60 and 70 include electrically insulating portions 64 and 74, respectively, as well as electrically conductive base portions 65 and 75, respectively. The packages also each include a source lead 61/71, a gate lead 62/72, and a drain lead 63/73, the leads each connected to and extending from one of the sidewalls of the insulating portions 64 and 74, respectively. In some implementations, only a portion of each of the base portions 65 and 75 is electrically conductive, while in other implementations the entirety of each of base portions 65 and 75 is electrically conductive. In an alternative implementation to that illustrated in FIGS. 6-8, portions 64 and 74 of the packages are formed of electrically conducting material, and the source, gate, and drain leads are separated from portions 64 and 74 by an insulating material in order to electrically isolate the leads from portions 64 and 74.

The transistors 90 (shown in FIGS. 8a and 8b) can be E-mode or D-mode transistors, although in many applications E-mode transistors are preferable. The transistors 90 are typically high-voltage switching transistors. As used herein, a "high-voltage switching device", such as a high-voltage switching transistor, is an electronic device which is optimized for high-voltage switching applications. That is, when the transistor is off, it is capable of blocking high voltages, such as about 300V or higher, about 600V or higher, about 1200V or higher, or about 1700V or higher, and when the transistor is on, it has a sufficiently low on-resistance ($R_{ON}$) for the application in which it is used, i.e., it experiences sufficiently low conduction loss when a substantial current passes through the device. A high-voltage device can at least be capable of blocking a voltage equal to the high-voltage supply or the maximum voltage in the circuit for which it is used. A high-voltage device may be capable of blocking 300V, 600V, 1200V, 1700V, or other suitable blocking voltage required by the application. In other words, a high-voltage device can block any voltage between 0V and at least $V_{max}$, where $V_{max}$ is the maximum voltage that could be supplied by the circuit or power supply. In some implementations, a high-voltage device can block any voltage between 0V and at least $2*V_{max}$. As used herein, a "low-voltage device", such as a low-voltage transistor, is an electronic device which is capable of blocking low voltages, such as between 0V and $V_{low}$ (where $V_{low}$ is less than $V_{max}$), but is not capable of blocking voltages higher than $V_{low}$. In some implementations, $V_{low}$ is equal to about $|V_{th}|$, greater than $|V_{th}|$, about $2*|V_{th}|$, about $3*|V_{th}|$, or between about $|V_{th}|$ and $3*|V_{th}|$, where $|V_{th}|$ is the absolute value of the threshold voltage of a high-voltage transistor, such as a high-voltage-depletion mode transistor, contained within a hybrid component, such as that illustrated in FIGS. 7a and 7b and described in further detail below. In other implementations, $V_{low}$ is about 10V, about 20V, about 30V, about 40V, or between about 5V and 50V, such as between about 10V and 40V. In yet other implementations, $V_{low}$ is less than about $0.5*V_{max}$, less than about $0.3*V_{max}$, less than about $0.1*V_{max}$, less than about $0.05*V_{max}$, or less than about $0.02*V_{max}$.

Referring to FIGS. 8a and 8b, in some implementations, the transistors 90 are lateral devices, such as lateral field-effect transistors. That is, the transistor channel is contained within a semiconductor layer 94 of the transistor 90, and the source, gate, and drain electrodes 91-93, respectively, are on the same side of the semiconductor layer 94, as shown. Specifically, the portions of the source and drain electrodes 91 and 93 that form an ohmic contact to the channel in layer 94, as well as the portion of the gate electrode 92 that modulates the current in the channel, are each on the same side of the semiconductor layer 94.

In some implementations, transistors 90 are III-Nitride transistors, such as III-Nitride high electron mobility transistors (HEMTs). III-Nitride transistors are suitable for many of the applications in which the electronic component of FIGS. 6-7 is used, due to their ability to incur minimal switching losses when they are hard-switched at high switching rates. As used herein, the terms III-Nitride or III-N materials, layers, devices, structures, etc., refer to a material, layer, device, or structure comprised of a compound semiconductor material according to the stoichiometric formula $Al_xIn_yGa_zN$, where x+y+z is about 1. III-Nitride materials can also include the group-III element Boron (B). In a III-Nitride or III-N device, such as a transistor or HEMT, the conductive channel can be partially or entirely contained within a III-N material layer.

Still referring to FIG. 8a, transistor 90 is connected to the package of high-side switch 60 as follows. The transistor 90 is mounted over or directly on the package base portion 65.

Layer 95, which is electrically insulating or semi-insulating, is between semiconductor layer 94 and the package base portion 65, and serves to electrically isolate semiconductor layer 94 from the package base portion 65. In some implementations, layer 95 is an insulating or semi-insulating substrate on top of which semiconductor layer 94 of transistor 90 is epitaxially grown. Source electrode 91 is electrically connected by a wire bond 34 to source lead 61. Gate electrode 92 is electrically connected by another wire bond 34 to gate lead 62. Drain electrode 93 (through another wire bond 34) and drain lead 63 are each electrically connected to the conductive portion of the package base 65. Electrical connections to and from the transistor electrodes 91-93 can be formed by wire bonds 34, as shown in FIG. 8a, or alternatively by other types of electrical connectors.

As used herein, two or more contacts or other items such as conductive layers or components are said to be "electrically connected" if they are connected by a material which is sufficiently conducting to ensure that the electric potential at each of the contacts or other items is substantially the same or about the same regardless of bias conditions.

Referring to FIG. 8b, transistor 90 is connected to the package of low-side switch 70 as follows. The transistor 90 is mounted over or directly on the package base portion 75. Layer 95, which is electrically insulating or semi-insulating, is between semiconductor layer 94 and the package base portion 75, and serves to electrically isolate semiconductor layer 94 from the package base portion 75. In some implementations, layer 95 is an insulating or semi-insulating substrate on top of which semiconductor layer 94 of transistor 90 is epitaxially grown. Drain electrode 93 is electrically connected to by a wire bond 34 to drain lead 73. Gate electrode 92 is electrically connected by another wire bond 34 to gate lead 72. Source electrode 93 (through yet another wire bond 34) and source lead 73 are each electrically connected to the conductive portion of the package base 75. Electrical connections to and from the transistor electrodes 91-93 can be formed by wire bonds 34, as shown in FIG. 6b, or alternatively by other types of electrical connectors.

Referring back to FIGS. 6 and 7a-7b, high-side switch 60 and low-side switch 70 are mounted on opposite sides of substrate 85 and are inverted relative to one another. In order to minimize parasitic inductances, high-side switch 60 and low-side switch 70 can be mounted opposite one another, such that at least 50% of the area of the conductive base portion 65 of the high-side switch 60 is opposite the conductive base portion 75 of the low-side switch 70, as illustrated in FIG. 6. Substrate 85, which can for example be a 2-layer printed circuit board (PCB) substrate, includes electrically conductive metal layers 81 and 82 on opposite sides of an electrically insulating material 83, configured as shown. As seen in FIGS. 6 and 7a-7b, the conductive base portion 65 of the package of high-side switch 60 is electrically connected to conductive metal layer 81, which can be achieved by mounting the conductive base portion 65 directly on conductive metal layer 81 as shown. Similarly, the conductive base portion 75 of the package of low-side switch 70 is electrically connected to conductive metal layer 82, which can be achieved by mounting the conductive base portion 75 directly on conductive metal layer 82 as shown. In some implementations, an electrically and/or thermally conductive adhesive is used to secure conductive base portions 65 and 75 to conductive metal layers 81 and 82, respectively.

Figure 5B:
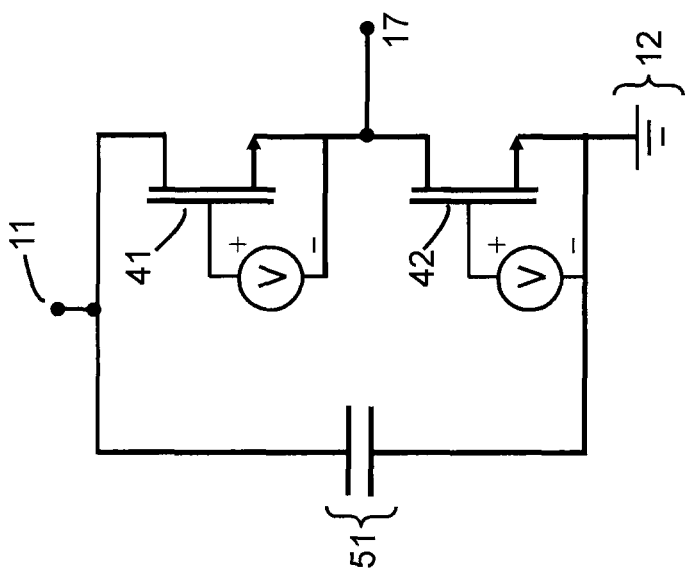

In addition to providing a rigid surface to which switches 60 and 70 can be secured, substrate 85 also serves the function of capacitor 51 in the circuit diagrams of FIGS. 5a and 5b. That is, substrate 85 is configured to be a parallel-plate capacitor, where the capacitance is proportional to the area of the surfaces of metal layers 81 and 82 to which conductive base portions 65 and 75, respectively, are connected to. As such, the drain 93 of high-side switch 60 is electrically connected to conductive metal layer 81, and the source 91 of low-side transistor 70 is electrically connected to conductive metal layer 82, as further detailed below.

Referring to FIGS. 6, 7a, and 8a, because the conductive base portion 65 of the package of high-side switch 60 is electrically connected both to conductive metal layer 81 (on which it is mounted) and to the drain electrode 93 (via wire bond 34) of the transistor 90 of high-side switch 60, the drain electrode 93 of high-side switch 60 is electrically connected to metal layer 81. The direct connection between conductive base portion 65 and conductive metal layer 81, along with the short length of the wire bond 34 between the drain electrode 93 and the conductive base portion 65, ensures that the electrical connection between the drain electrode 93 of high-side switch 60 and the metal layer 81 is a low inductance connection, thereby minimizing parasitic inductance between the drain 93 of the transistor of high-side switch 60 and conductive metal 81. This parasitic inductance was represented by inductor 52 in FIG. 5b.

Similarly, referring to FIGS. 6, 7b, and 8b, because the conductive base portion 75 of the package of low-side switch 70 is electrically connected both to conductive metal layer 82 (on which it is mounted) and to the source electrode 91 (via wire bond 34) of the transistor 90 of low-side switch 70, the source electrode 91 of low-side switch 70 is electrically connected to metal layer 82. The direct connection between conductive base portion 75 and conductive metal layer 82, along with the short length of the wire bond 34 between the source electrode 91 and the conductive base portion 75, ensures that the electrical connection between the source electrode 91 of low-side switch 70 and the metal layer 82 is a low inductance connection, thereby minimizing parasitic inductance between the source 91 of the transistor of low-side switch 70 and conductive metal 81. This parasitic inductance was represented by inductor 53 in FIG. 5b.

Metal layer 81, in addition to being one of the plates of capacitor 51 in FIGS. 5a and 5b, can also serve as a high-voltage plane. That is, it can be configured to be connected directly to the circuit high voltage supply. As such, metal layer 81 can include means, for example a bonding pad (not shown), for connecting the metal layer 81 to the circuit high voltage supply. Preferably, the connection between the circuit high voltage supply and the metal layer 81 is formed as close as possible to the high-side switch 60 in order to minimize parasitic inductances. Similarly, metal layer 82 can also serve as a low-voltage or ground plane. That is, it can be configured to be connected directly to the circuit low voltage supply or to DC ground. As such, metal layer 82 can include means, for example a bonding pad (not shown), for connecting the metal layer 82 to the circuit low voltage supply pr DC ground. Preferably, the connection between the metal layer 82 and the circuit low voltage supply or DC ground is formed as close as possible to the low-side switch 70 in order to minimize parasitic inductances.

As seen in FIGS. 5a and 5b, in a half bridge circuit the source electrode of the high-side switch 41 is electrically connected to the drain electrode of the low-side switch 42. In the electronic component of FIGS. 6 and 7a-7b, this is accomplished by connecting the source lead 61 of the high-side switch 60 to the drain lead 73 of the low-side switch 70. Parasitic inductances in this connection can be minimized by making the connector 22 as short as possible. This can be accomplished by ensuring that the source lead 61 of the high-side switch 60 is substantially aligned to the drain lead 73 of the low-side switch, and by passing the connector 22 through via hole 23 in the substrate 85, as shown. The electrical load (not shown) being driven by the circuit is then electrically connected to any one of the source lead 61 of the high-side switch 60, the drain lead 73 of the low-side switch, or the connector 22.

In many cases, the capacitance of substrate 85 may not be large enough for stable circuit operation. In these cases, one or more additional capacitors 31, shown in FIGS. 6 and 7b, can be connected in parallel to the capacitor formed by substrate 85. That is, one side of each of capacitors 31 is connected to metal layer 81, and the opposite side of each of capacitors 31 is connected to metal layer 82. In order to minimize parasitic inductances, capacitors 31 are placed as close as possible to switches 60 and 70, and the connectors between capacitors 31 and metal layers 81 and 82 are made as short as possible. As seen in FIGS. 6 and 7a-7b, the capacitors 31 can be mounted on one side of substrate 85, with each capacitor being near a via hole 33. One side of each capacitor 31 is then electrically connected to the same metal layer of substrate 85 on which the capacitor 31 is mounted, and the connector on the opposite side of each capacitor passes through the via hole 33 and is electrically connected to the metal layer on the opposite side of substrate 85 from the capacitor. In some implementations, the electrical connections between the capacitors 31 and metal layers 81 and 82 are formed by solder bonds 32, as shown.

Figure 9B:
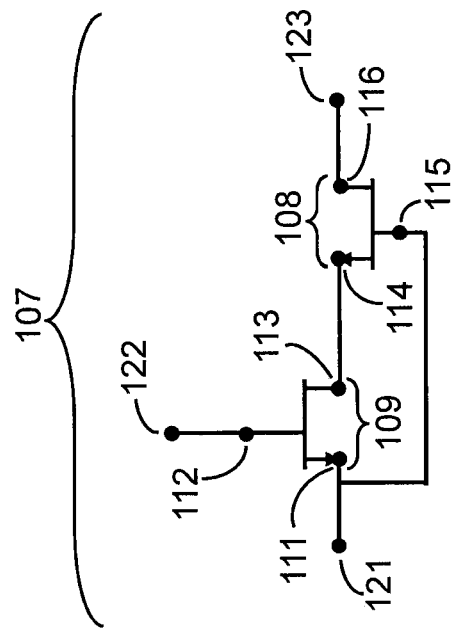
FIGS. 9a-9b illustrate electronic devices that can be used in electronic modules.
Figure 9A:
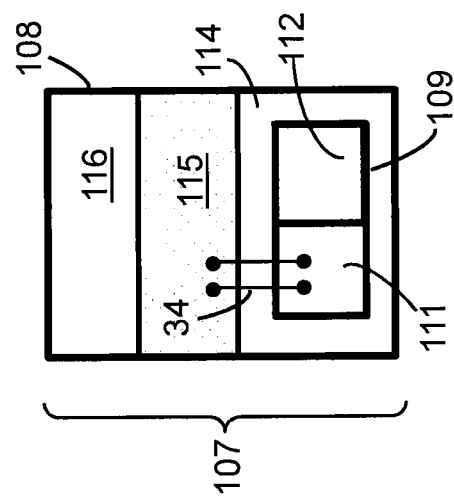

While in FIGS. 8a and 8b, switches 60 and 70 are each shown to be formed of a single lateral transistor 90 encased in a package, other devices could be used instead. For example, a hybrid device 107, shown in FIGS. 9a and 9b, could be used in place of transistor 90 in switches 60 and 70. Since high-voltage enhancement-mode transistors can be difficult to fabricate reliably, one alternative to a single high-voltage E-mode transistor is to combine a high-voltage D-mode transistor 108 with a low-voltage E-mode transistor 109 in the configuration of FIGS. 9a and 9b to form a hybrid device 107. Hybrid device 107 can be operated in the same way as a single high-voltage E-mode transistor, and in many cases achieves the same or similar output characteristics as a single high-voltage E-mode transistor. FIG. 9a shows a plan view schematic diagram of hybrid device 107, and FIG. 9b shows a circuit schematic of hybrid device 107. Hybrid device 107 includes a high-voltage D-mode transistor 108 and a low-voltage E-mode transistor 109. In the configuration illustrated in FIGS. 9a and 9b, E-mode transistor 109 is a vertical transistor, having its drain electrode 113 on the opposite side of the device from its source electrode 111 and gate electrode 112, and D-mode transistor 108 is a lateral transistor, having its source electrode 114, gate electrode 115, and drain electrode 116 all on the same side of the device. However, other configurations for each of transistors 108 and 109 are possible as well.

The source electrode 111 of the low-voltage E-mode transistor 109 and the gate electrode 115 of the high-voltage D-mode transistor 108 are electrically connected together, for example with wire bonds 34, and together form the source 121 of the hybrid device 107. The gate electrode 112 of the low-voltage E-mode transistor 109 functions as the gate 122 of the hybrid device 107. The drain electrode 116 of the high-voltage D-mode transistor 108 functions as the drain 123 of the hybrid device 107. The source electrode 114 of the high-voltage D-mode transistor 108 is electrically connected to the drain electrode 113 of the low-voltage E-mode transistor 109. As seen in FIG. 7a, drain electrode 113, which is on the opposite side of the E-mode transistor 109 from the source and drain electrodes 111 and 112, respectively, can be electrically connected to source electrode 114 by mounting the low-voltage E-mode transistor 109 directly on top of the source electrode 114 with the drain electrode 113 directly contacting the source electrode 114, for example by using a conductive solder or resin. As such, the footprint (and therefore the cross-sectional area) of the low-voltage E-mode transistor 109 can be smaller than that of the high-voltage D-mode transistor 108, and in particular the footprint of the low-voltage E-mode transistor 109 can be smaller than that of the source electrode 114 high-voltage D-mode transistor 108.

As used herein, a "hybrid enhancement-mode electronic device or component", or simply a "hybrid device or component", is an electronic device or component formed of a depletion-mode transistor and a enhancement-mode transistor, where the depletion-mode transistor is capable of a higher operating and/or breakdown voltage as compared to the enhancement-mode transistor, and the hybrid device or component is configured to operate similarly to a single enhancement-mode transistor with a breakdown and/or operating voltage about as high as that of the depletion-mode transistor. That is, a hybrid enhancement-mode device or component includes at least 3 nodes having the following properties. When the first node (source node) and second node (gate node) are held at the same voltage, the hybrid enhancement-mode device or component can block a positive high voltage (i.e., a voltage larger than the maximum voltage that the enhancement-mode transistor is capable of blocking) applied to the third node (drain node) relative to the source node. When the gate node is held at a sufficiently positive voltage (i.e., greater than the threshold voltage of the enhancement-mode transistor) relative to the source node, current passes from the source node to the drain node or from the drain node to the source node when a sufficiently positive voltage is applied to the drain node relative to the source node. When the enhancement-mode transistor is a low-voltage device and the depletion-mode transistor is a high-voltage device, the hybrid component can operate similarly to a single high-voltage enhancement-mode transistor. The depletion-mode transistor can have a breakdown and/or maximum operating voltage that is at least two times, at least three times, at least five times, at least ten times, or at least twenty times that of the enhancement-mode transistor.

In typical power switching applications in which high-voltage switching transistors are used, the transistor is, during the majority of time, in one of two states. In the first state, which is commonly referred to as the "on state", the voltage at the gate electrode relative to the source electrode is higher than the transistor threshold voltage, and substantial current flows through the transistor. In this state, the voltage difference between the source and drain is typically low, usually no more than a few volts, such as about 0.1-5 volts. In the second state, which is commonly referred to as the "off state", the voltage at the gate electrode relative to the source electrode is lower than the transistor threshold voltage, and no substantial current, apart from off-state leakage current, flows through the transistor. In this second state, the voltage between the source and drain can range anywhere from about 0V to the value of the circuit high voltage supply, which in some cases can be as high as 100V, 300V, 600V, 1200V, 1700V, or higher, but can be less than the breakdown voltage of the transistor. In some applications, inductive elements in the circuit cause the voltage between the source and drain to be even higher than the circuit high voltage supply. Additionally, there are short times immediately after the gate has been switched on or off during which the transistor is in a transition mode between the two states described above. When the transistor is in the off state, it is said to be "blocking a voltage" between the source and drain. As used herein, "blocking a voltage" refers to the ability of a transistor, device, or component to prevent significant current, such as current that is greater than 0.001 times the average operating current during regular on-state conduction, from flowing through the transistor, device, or component when a voltage is applied across the transistor, device, or component. In other words, while a transistor, device, or component is blocking a voltage that is applied across it, the total current passing through the transistor, device, or component will not be greater than 0.001 times the average operating current during regular on-state conduction.

The electronic components described herein are configured such that the switches, and the transistors which are included in the switches, can be switch high voltages and/or high currents at high switching rates without destabilizing the circuit in which the electronic component is used, or causing damage to circuit components. In conventional half bridge circuits formed of a high-side and a low-side switch, where each switch is formed of one or more transistors and individually packaged (that is, the transistors of the high-side switch are all encased in a first package, and the transistors of the low-side switch are all encased in a second package), it is typically difficult or impossible to switch high voltages and/or high currents at high switching rates without destabilizing the circuit in which the electronic component is used, since parasitic inductances are typically too large. By utilizing the half bridge configuration illustrated in FIGS. 6 and 7a-7b, successful switching at a rate of at least 100 Volts/nanosecond has been demonstrated under conditions where the voltage being switched was at least 300 Volts and the current being switched was at least 3 Amps, as further described below. In additional tests, successful switching at a rate of at least 100 Volts/nanosecond was demonstrated under conditions where the voltage being switched was at least 400 Volts and the current being switched was at least 6 Amps. For switching of currents as high as 3 Amps, prior implementations of half bridge circuits utilizing individually packaged switches have not successfully been able to switch voltages of at least 300 Volts at switching rates of at least 100 Volts/nanosecond.

Figure 10A:
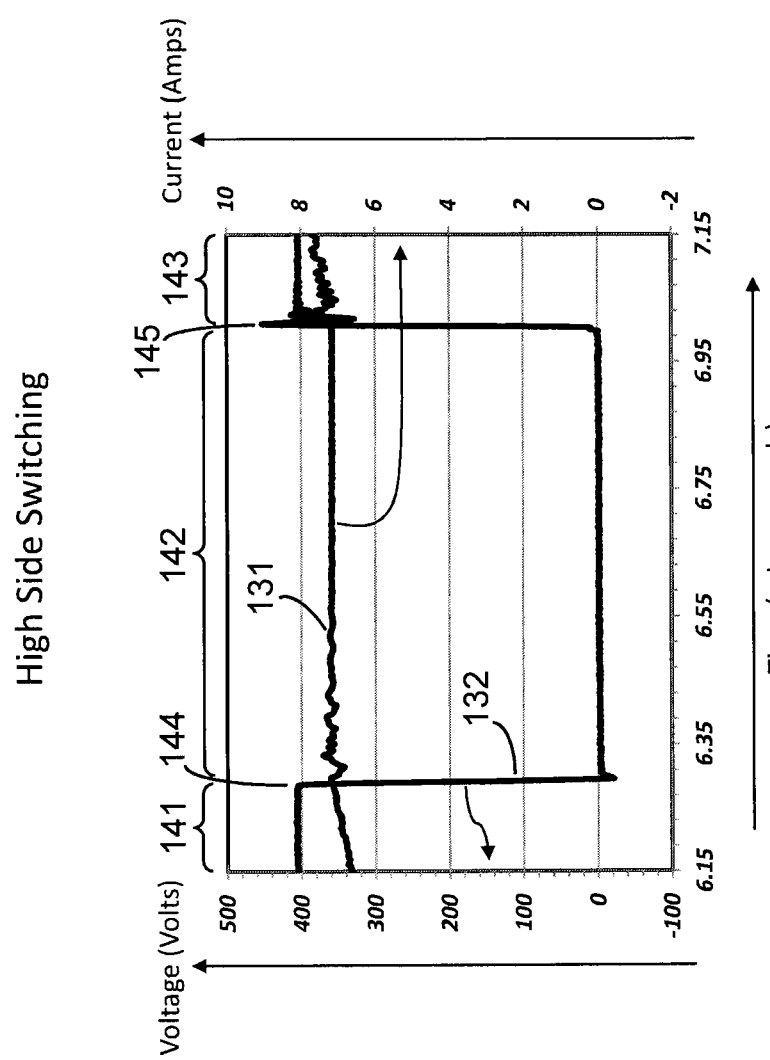
FIG. 10a is a plot of current and voltage characteristics as a function of time for high-side switching of a half bridge circuit driving an inductive load.

FIG. 10a shows a plot of current and voltage characteristics as a function of time for high-side switching of a half bridge circuit driving an inductive load. The circuit is configured as in FIGS. 2a-2c, but with the electronic component of FIG. 6 used in place of half bridge 15. Referring to FIGS. 10a, 2a-2c, and 6, the high-side and low-side switches of the half bridge each include the hybrid device 107 of FIGS. 9a and 9b. The current that is plotted in FIG. 10a is the current 27 passing through the inductive load 21, and the voltage plotted in FIG. 10a is the voltage at node 17 (the common node shared by the inductive load 21, the source lead 61 of the high-side switch, and the drain lead 73 of the low-side switch).

The operating conditions for the circuit during the current and voltage measurements of FIG. 10a were as follows. Node 18, the node of the inductive load 21 opposite the half bridge which was being driven, was held at or near ground. Metal layer 82 of the electronic component shown in FIG. 6, which is electrically connected to the source of low-side switch 70, was electrically connected to DC ground. Metal layer 81 of the electronic component shown in FIG. 6, which is electrically connected to the drain of high-side switch 60, was electrically connected to a 400 Volt DC voltage supply. The gate lead 72 of the low-side switch 70 was biased relative to the source lead 71 of the low-side switch 70 at a voltage lower than the threshold voltage of the low-side switch 70, such that low-side switch 70 was biased in the OFF state.

Figure 2B:
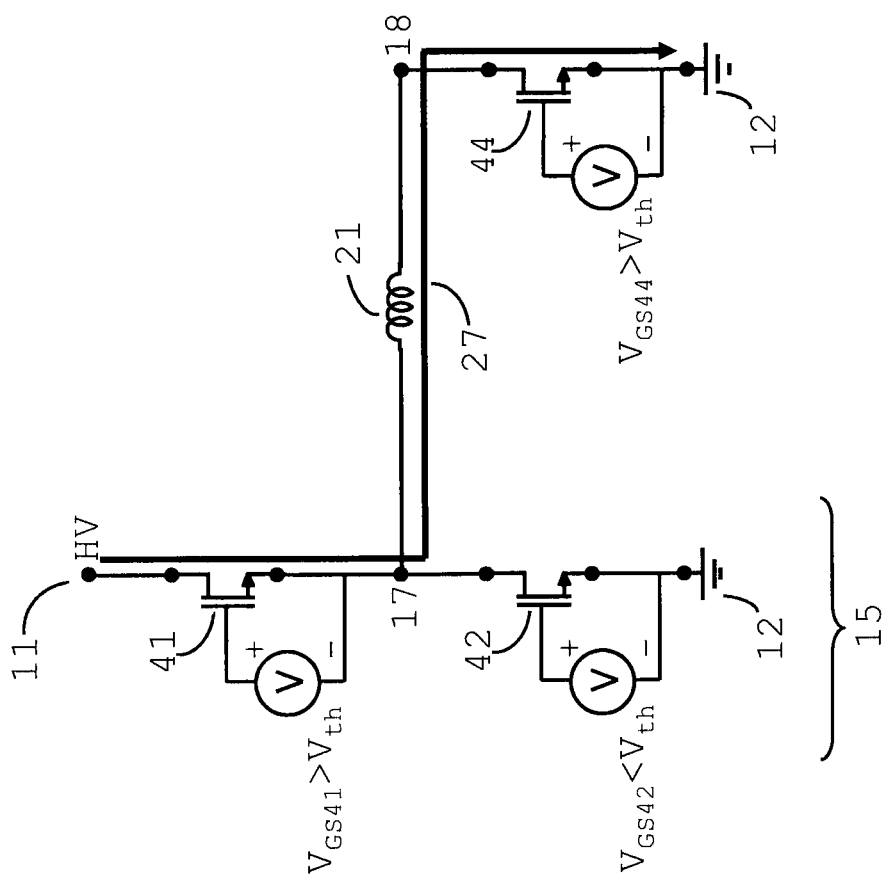

During time period 141, high-side switch 60 was biased ON (i.e., the voltage of gate lead 62 relative to source lead 61 was greater than the threshold voltage of switch 60), causing current to flow through both the high-side switch 60 and the inductive load 21, as in FIG. 2b, while the low-side switch 70 blocked a voltage of about 400 Volts. As seen in FIG. 10a, during time period 141, the load current 131 increased approximately linearly to a value greater than 7 Amps at the end of time period 141, and the voltage at node 17 remained approximately constant at about 400 Volts.

Figure 2C:
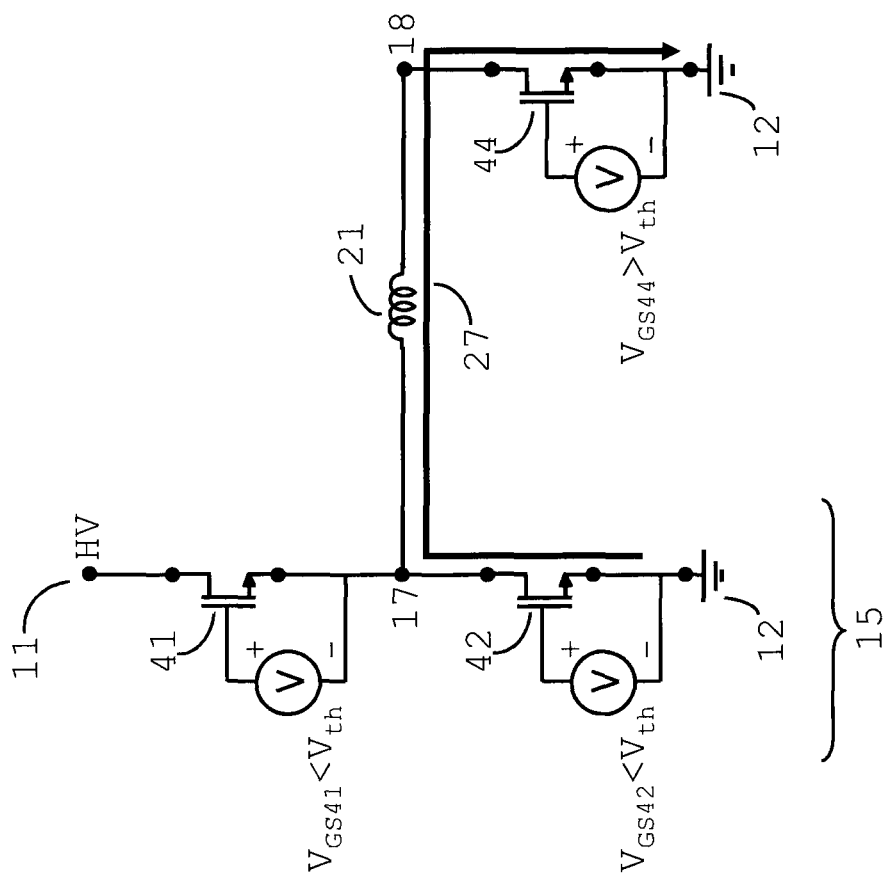

Still referring to FIG. 10a, at time 144, the high-side switch 60 was switched OFF, causing the high-side switch 60 to block a voltage of about 400 Volts and causing the load current to flow in the reverse direction through low-side switch 70, as in FIG. 2c. During time period 142, which immediately followed the switching at time 144, the load current 131 stayed approximately constant at a value greater than 7 Amps, and the voltage at node 17 remained approximately constant at about 0 Volts. Only small ripple currents (i.e., current fluctuations) were observed immediately following switching time 144, and the current during time period 142 never exceeded 1.1 times the mean current value during this time period. Voltage fluctuations immediately following switching time 144 were also extremely low.

At time 145, the high-side switch 60 was switched back ON, causing the load current to again flow through both the high-side switch 60 and the inductive load 21, as in FIG. 2b, while the low-side switch blocked a voltage of about 400 Volts. As seen in FIG. 10a, during time period 143 which immediately followed switching time 145, the load current 131 increased approximately linearly to a value greater than 7 Amps (nearly 8 Amps) at the end of time period 143, and the voltage at node 17 remained approximately constant at about 400 Volts. Some ringing was observed in both the current 131 and voltage 132 immediately after switching time 145. However, the voltage never exceeded 500 Volts (i.e., 1.25 times the circuit high voltage), and the amplitude of the current fluctuations never exceeded 0.1 times the mean current value during time period 142.

Figure 3A:
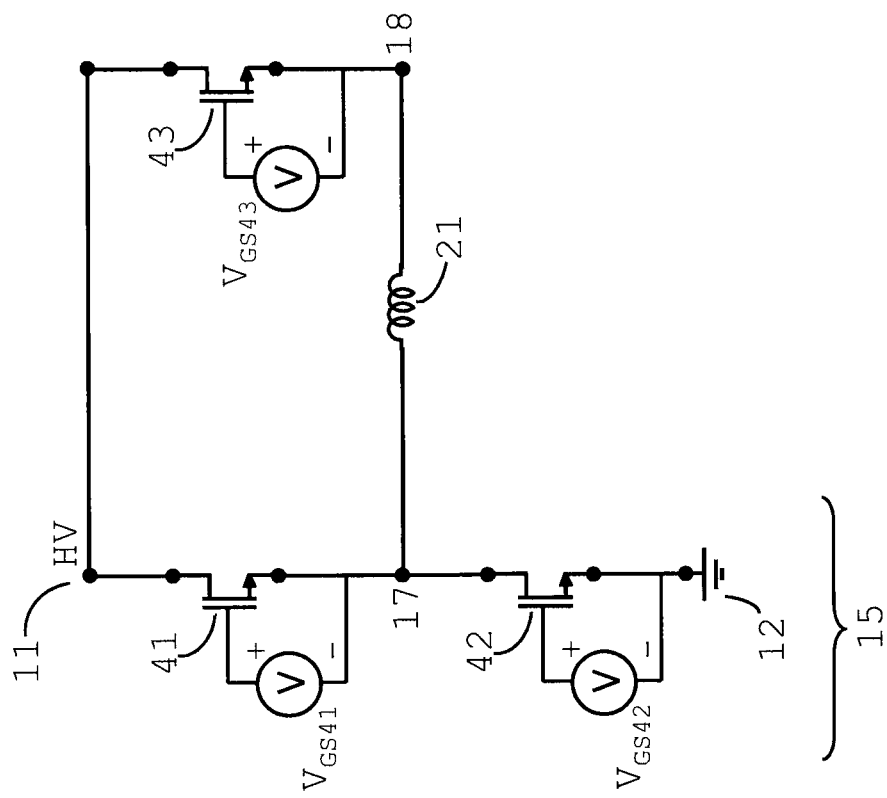
Figure 10B:
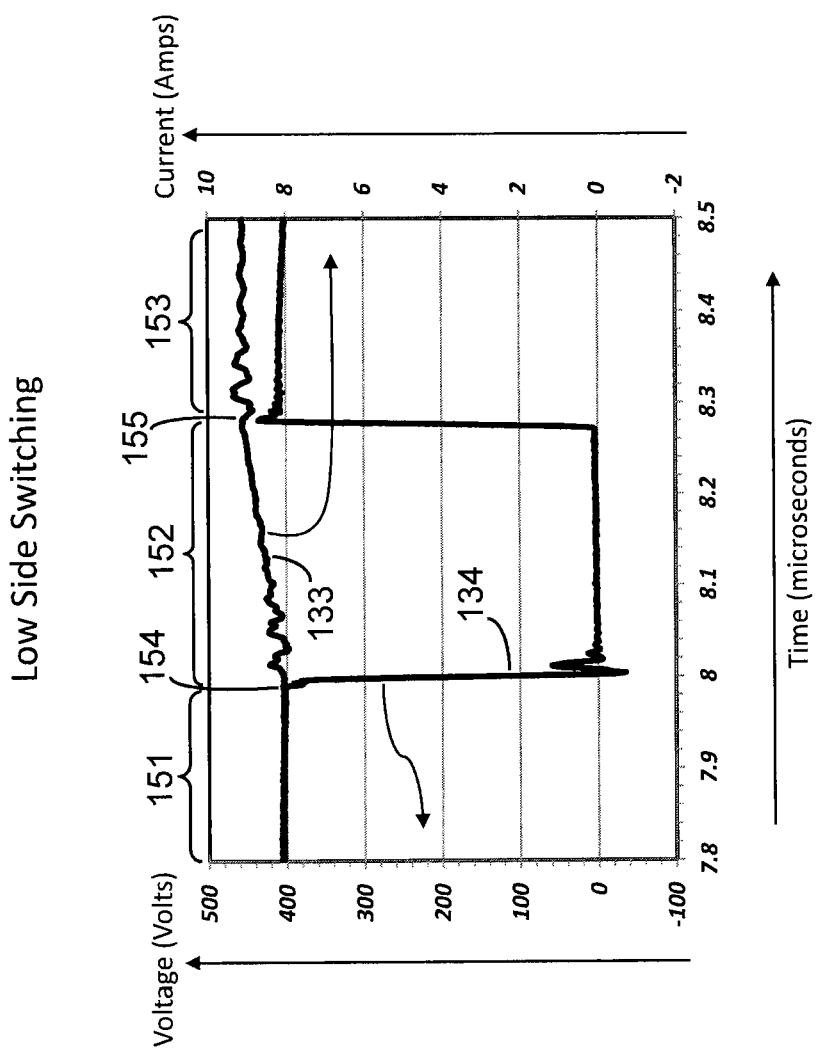
FIG. 10b is a plot of current and voltage characteristics as a function of time for low-side switching of a half bridge circuit driving an inductive load.

FIG. 10b shows a plot of current and voltage characteristics as a function of time for low-side switching of a half bridge circuit driving an inductive load, configured as in FIG. 3a, but with the electronic component of FIG. 6 used in place of half bridge 15. The high-side and low-side switches of the half bridge each include the hybrid device 107 of FIGS. 9a and 9b. Referring to FIGS. 10b, 6, and 3a, the current that is plotted in FIG. 10b is the current 27 passing through the inductive load 21, and the voltage plotted in FIG. 10b is the voltage at node 17 (the common node shared by the inductive load 21, the source lead 61 of the high-side switch, and the drain lead 73 of the low-side switch).

The operating conditions for the circuit during the current and voltage measurements of FIG. 10b were as follows. Node 18, the node of the inductive load 21 opposite the half bridge which was being driven, was held at or near 400 Volts DC. Metal layer 82 of the electronic component shown in FIG. 6, which is electrically connected to the source of low-side switch 70, was electrically connected to DC ground. Metal layer 81 of the electronic component shown in FIG. 6, which is electrically connected to the drain of high-side switch 60, was electrically connected to a 400 Volt DC voltage supply. The gate lead 62 of the high-side switch 60 was biased relative to the source lead 61 of the high-side switch 60 at a voltage lower than the threshold voltage of the high-side switch 60, such that high-side switch 60 was biased in the OFF state.

Figure 3B:
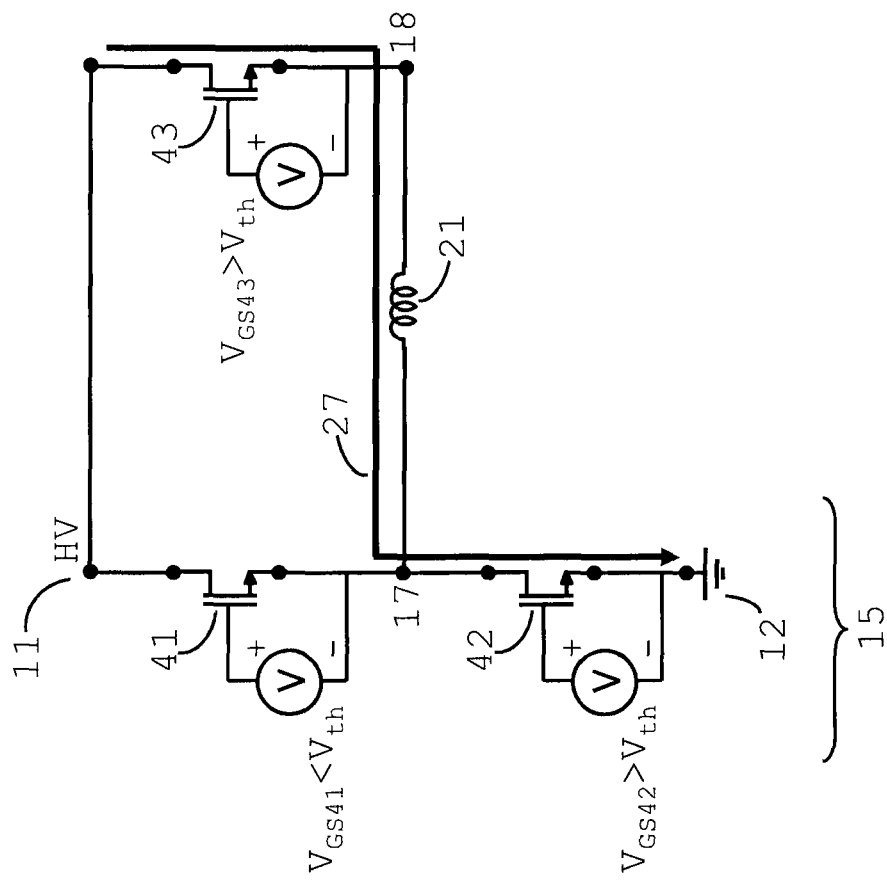
Figure 3C:
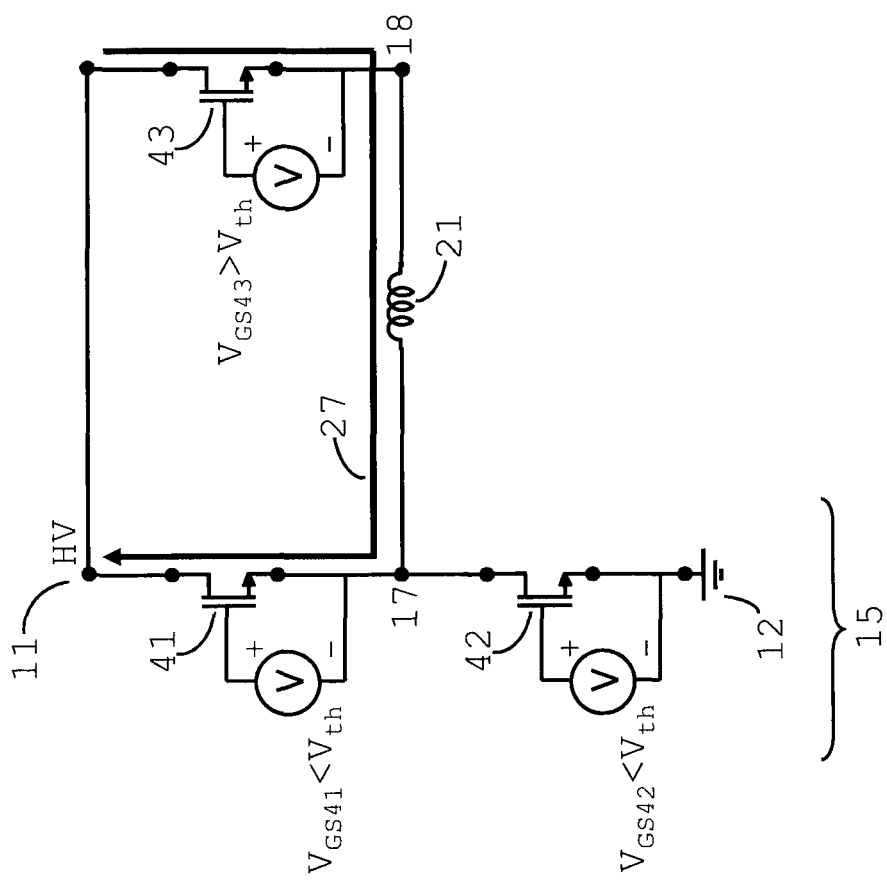
Figure 4:
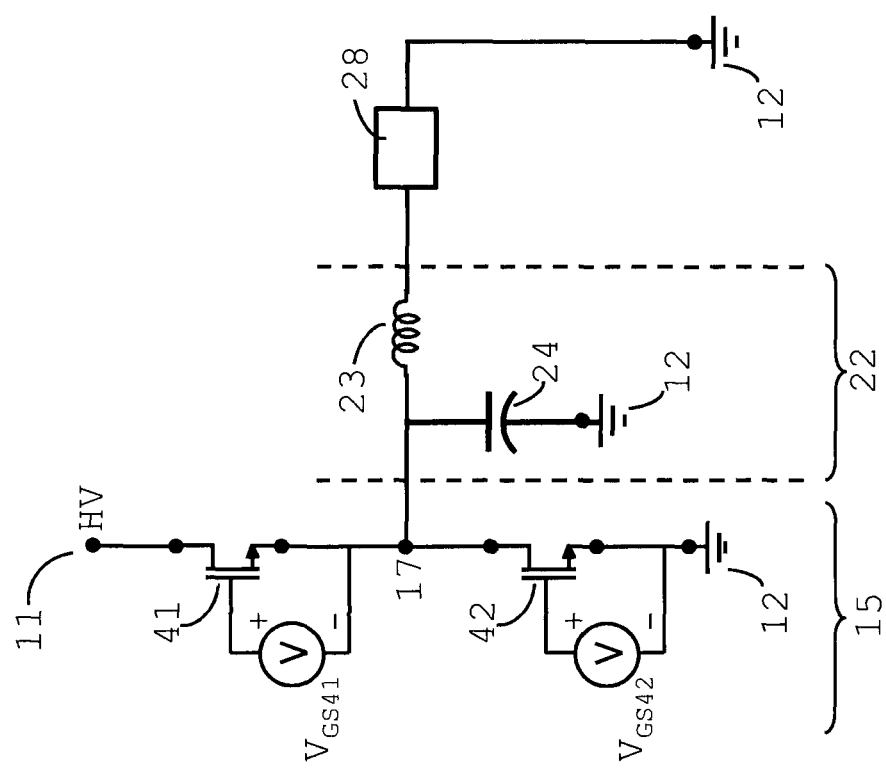
FIG. 4 illustrates a circuit which utilizes a half bridge to drive an electrical load.

During time period 151, low-side switch 70 was biased OFF (i.e., the voltage of gate lead 72 relative to source lead 71 was less than the threshold voltage of switch 70), causing current to flow through both the high-side switch 60 and the inductive load 21, as in FIG. 3c, while the low-side switch 70 blocked a voltage of about 400 Volts. As seen in FIG. 10b, during time period 151, the load current 133 remained approximately constant at value of about 8 Amps or greater, and the voltage at node 17 remained approximately constant at about 400 Volts.

Still referring to FIGS. 6, 3a-c, and 10b, at time 154 the low-side switch 70 was switched ON, causing the high-side switch 60 to block a voltage of about 400 Volts and causing the load current to flow through low-side switch 60, as in FIG. 3b. During time period 152, which immediately followed the switching at time 154, the load current 133 increased approximately linearly to a value greater than 9 Amps, and the voltage at node 17 remained approximately constant at about 0 Volts. Only small ripple currents (i.e., current fluctuations) were observed immediately following switching time 154, and the magnitude of the current fluctuations during time period 152 never exceeded 1.1 times the mean current value during time period 151. Voltage fluctuations immediately following switching time 154 were also very low.

At time 155, the low-side switch 60 was switched back OFF, causing the load current to again flow through both the high-side switch 60 and the inductive load 21, as in FIG. 3c, while the low-side switch 60 blocked a voltage of about 400 Volts. As seen in FIG. 10b, during time period 153 which immediately followed switching time 155, the load current 133 remained approximately constant at a value greater than 9 Amps, and the voltage at node 17 remained approximately constant at about 400 Volts. Some ringing was observed in both the current 133 and voltage 134 immediately after switching time 155. However, the voltage never exceeded 460 Volts (i.e., 1.15 times the circuit high voltage), and the amplitude of the current fluctuations never exceeded 0.1 times the mean current value during time period 153.

Figure 11:
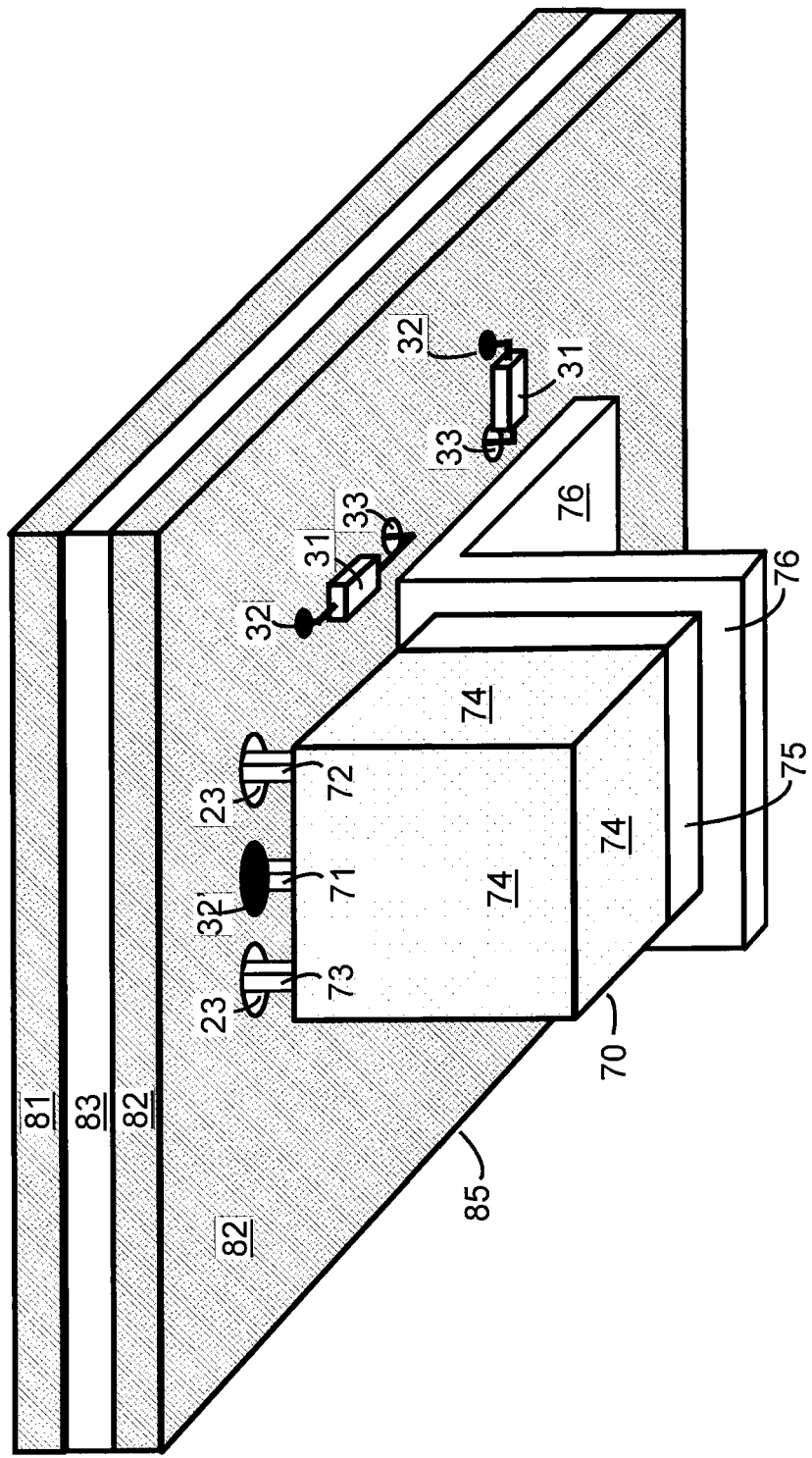
FIG. 11 is a perspective view of an electronic component.

FIG. 11 illustrates an alternative configuration for the low-side switch 70 of FIGS. 6 and 7b. As seen in FIG. 11, instead of mounting the low-side switch 70 directly on metal layer 82, as in FIGS. 6 and 7b, a metal mount 76 is attached to metal layer 82, and the low-side switch 70 is attached to the metal mount 76 with conductive portion 75 electrically connected to the metal mount 76. In the implementation shown in FIG. 11, the metal mount 76 includes an L-shaped bend, such that the portion of metal mount 76, to which the low-side switch 70 is attached, is substantially perpendicular to the portion of metal mount 76 which is attached to metal layer 82. As such, low-side switch 70 is mounted such that leads 71-73 extend towards and are substantially parallel to the direction normal to the surface of metal layer 82, as shown. Source lead 71 can be made shorter than leads 72 and 73, and can be electrically connected to metal layer 82, for example with a solder bond 32', as shown. Gate and drain leads 72 and 73, respectively, can extend through the entire thickness of substrate 85, passing through via holes 23, as illustrated in FIG. 11. On the opposite side of substrate 85 to that shown in FIG. 11 (i.e., on the side of substrate 85 on which high-side switch 60 is mounted), drain lead 72 of low side switch 70 can be electrically connected to source lead 61 of the high-side switch 60 (connection now shown), and gate lead 71 can be connected to a gate drive circuit (also not shown). Metal mount 76 can optionally be connected to a heat sink (not shown).

The configuration for low-side switch 70 shown in FIG. 11 can be advantageous in that it allows the electronic component to be assembled without having to bend any of the leads 71-73 of low-side switch 70. High-side switch 60 can still be configured as shown in FIGS. 6 and 7a, with the source lead 61 of high-side switch 60 being substantially aligned with the drain lead 73 of low-side switch 70. Alternatively, low-side switch 70 can be mounted with the surface of conductive base 75 parallel to the surface of metal layer 82, as in FIGS. 6 and 7b, and high-side switch 60 can be mounted on an L-shaped metal mount 76 (not shown), similar to the configuration in FIG. 11, with source and gate leads 61 and 62 from the high side switch (not shown), separately passing through one of via holes 23 formed in the substrate 85, and drain lead 63 (not shown) being electrically connected to metal layer 81.

A number of implementations have been described. Nevertheless, it will be understood that various modifications may be made without departing from the spirit and scope of the techniques and devices described herein. For example, transistors 44 and 43, which are used to sink or supply current in FIGS. 2a-c and 3a-c, respectively, can be configured to be soft-switched. Or, transistors 43-44 in FIGS. 2-3 could be eliminated and replaced with a conductive material that short-circuits the leads that the respective source and drain of each of the transistors was connected to. Furthermore, the low-voltage side of each of the bridge-circuits described herein could be connected to a DC voltage which is lower than the high-voltage HV, and in some cases could be negative, rather than connecting the low-voltage side to ground. Also, while the package leads 61-63 and 71-73 are shown in FIGS. 7a-b and 8a-b to extend from the side of the package, other package configurations with alternative lead configurations can be used. For example, a surface-mount package such as a QFN package could be used, in which case the leads are adjacent to the bottom of the package and are configured to be soldered to the structure that they are connected to. Additionally, in the electronic component of FIGS. 6 and 7a-7b, a metal mount can be included between the substrate 85 and either one of or both of switches 60 and 70, and the metal mount can optionally be connected to a heat sink. Accordingly, other implementations are within the scope of the following claims.

What is claimed is:

1. A half bridge, comprising:
   a first switch encased in a first package, the first package comprising a first conductive portion having a first area, the first transistor being mounted over the first conductive portion;
   a second transistor encased in a second package, the second package comprising a second conductive portion having a second area, the second transistor being mounted over the second conductive portion; and
   a substrate comprising an insulating layer and a metal layer; wherein
   the first package is on a first side of the substrate and the second package is on a second side of the substrate; and
   the first package is opposite the second package, with at least 50% of the first area of the first conductive portion being opposite the second area of the second conductive portion.

2. The half bridge of claim 1, the first package having a source lead and the second package having a drain lead, wherein the source and drain leads are electrically connected to one another.

3. The half bridge of claim 1, wherein the first switch has a first electrode which is electrically connected to the first conductive portion, and the second switch has a second electrode which is electrically connected to the second conductive portion.

4. The half bridge of claim 3, wherein the second electrode is a source electrode of the second switch.

5. The half bridge of claim 4, wherein the first electrode is a drain electrode of the first switch.

6. The half bridge of claim 1, wherein the first switch or the second switch comprises a III-Nitride transistor.

7. The half bridge of claim 1, wherein the first switch or the second switch comprises a lateral transistor.

8. The half bridge of claim 1, wherein the first switch comprises a first transistor and a second transistor, a source of the first transistor is electrically connected to a drain of the second transistor, and a gate of the first transistor is electrically connected to a source of the second transistor.

9. The half bridge of claim 8, wherein the first transistor is a high-voltage depletion-mode transistor, and the second transistor is a low-voltage enhancement-mode transistor.

10. The half bridge of claim 9, wherein low-voltage enhancement-mode transistor is mounted directly on top of the source of the high-voltage depletion-mode transistor.

11. The half bridge of claim 8, wherein the first transistor is a lateral transistor and the second transistor is a vertical transistor.

12. The half bridge of claim 1, wherein the metal layer comprises a metal mount.

13. The half bridge of claim 12, wherein the metal mount is connected to or is part of a heat sink.

14. A half bridge, comprising:
a capacitor comprising an insulating layer between a first conductive portion and a second conductive portion, the first conductive portion having a first area and the second conductive portion having a second area;
a first transistor encased in a first package, the first package comprising the first conductive portion; and
a second transistor encased in a second package, the second package comprising the second conductive portion; wherein
the first package is on a first side of the insulating layer and the second package is on a second side of the insulating layer.

15. The half bridge of claim 14, wherein the first package is opposite the second package, with at least 50% of the first area of the first conductive portion being opposite the second area of the second conductive portion.

16. The half bridge of claim 14, the first package having a drain lead and the second package having a source lead, wherein the source lead of the second package is electrically connected to the second conductive portion.

17. The half bridge of claim 16, wherein the drain lead of the first package is electrically connected to the first conductive portion.

18. A method of operating a half bridge circuit comprising a first switch encased in a first package and a second switch encased in a second package, the first switch and the second switch being on opposite sides of an insulating layer, the method comprising:
biasing a drain of the first switch at a voltage of at least 300 Volts relative to a source of the second switch;
biasing the first switch on and biasing the second switch off, thereby causing a current of at least 3 Amps to flow through the first switch and causing the second switch to block a voltage; and
at a first time switching the first switch off, causing the current to flow through the second switch and causing the first switch to block a voltage; wherein
the switching of the first switch comprises hard-switching of the first switch at a switching rate of at least 100 Volts/nanosecond.

19. The method of claim 18, wherein the first switch and the second switch each comprise one or more transistors.

20. The method of claim 18, further comprising at a second time switching the first switch from off to on, causing the current to flow through the first switch and causing the second switch to block a voltage.

21. The method of claim 20, wherein the second time is after the first time.

22. The method of claim 18, further comprising connecting the half bridge circuit to an electrical load, wherein the current flows through the electrical load.

23. The method of claim 18, wherein the drain of the first switch is biased at a voltage of at least 400 Volts relative to the source of the second switch.

24. A half bridge configured to be connected to an electrical load, the half bridge comprising:
a first switch encased in a first package and a second switch encased in a second package, the first switch comprising a first source and the second switch comprising a second drain, the first source being electrically connected to the second drain; wherein
the first switch and the second switch are on opposite sides of a metal mount; and
the half bridge is operable to hard-switch a voltage of at least 300 Volts across the electrical load at a switching rate of at least 100 Volts/nanosecond while a current of at least 3 Amps flows through the electrical load.

25. The half bridge of claim 24, wherein the current is at least 6 Amps.

26. The half bridge of claim 24, wherein the metal mount is connected to or is part of a heat sink.

27. The half bridge of claim 24, further comprising an insulating layer, wherein the first switch and the second switch are on opposite sides of the insulating layer.

28. The half bridge of claim 24, wherein the first switch comprises a first transistor and a second transistor, the first source is a source of the second transistor, a source of the first transistor is electrically connected to a drain of the second transistor, and a gate of the first transistor is electrically connected to the source of the second transistor.

29. The half bridge of claim 28, wherein the first transistor is a high-voltage depletion-mode transistor, and the second transistor is a low-voltage enhancement-mode transistor.

30. The half bridge of claim 29, wherein low-voltage enhancement-mode transistor is mounted directly on top of the source of the high-voltage depletion-mode transistor.

31. The half bridge of claim 28, wherein the first transistor is a lateral transistor and the second transistor is a vertical transistor.

* * * * *